(12) United States Patent
Toriumi

(10) Patent No.: US 11,881,816 B2
(45) Date of Patent: Jan. 23, 2024

(54) OSCILLATOR AND DEVICE

(71) Applicant: SEIKO EPSON CORPORATION, Tokyo (JP)

(72) Inventor: Yuichi Toriumi, Minowa-machi (JP)

(73) Assignee: SEIKO EPSON CORPORATION, Tokyo (JP)

( * ) Notice: Subject to any disclaimer, the term of this patent is extended or adjusted under 35 U.S.C. 154(b) by 12 days.

(21) Appl. No.: 17/875,874

(22) Filed: Jul. 28, 2022

(65) Prior Publication Data

US 2023/0032617 A1 Feb. 2, 2023

(30) Foreign Application Priority Data

Jul. 30, 2021 (JP) .................................. 2021-125125

(51) Int. Cl.
*H03B 5/32* (2006.01)
*H04B 1/04* (2006.01)
*H03B 5/04* (2006.01)

(52) U.S. Cl.
CPC ................ *H03B 5/32* (2013.01); *H03B 5/04* (2013.01); *H04B 1/04* (2013.01); *H03B 2200/0088* (2013.01)

(58) Field of Classification Search
CPC .............. H03B 5/04; H03B 5/32; H04B 1/04
See application file for complete search history.

(56) References Cited

U.S. PATENT DOCUMENTS

| 10,802,076 | B2* | 10/2020 | Uehara | H03B 5/32 |
| 2010/0020625 | A1 | 1/2010 | Morimoto et al. | |
| 2023/0034239 | A1* | 2/2023 | Toriumi | H03L 1/026 |
| 2023/0155548 | A1* | 5/2023 | Itasaka | H03B 5/368 |
| | | | | 331/70 |

FOREIGN PATENT DOCUMENTS

JP 2008-250576 A 10/2008

* cited by examiner

*Primary Examiner* — Khanh C Tran
(74) *Attorney, Agent, or Firm* — Rankin, Hill & Clark LLP

(57) ABSTRACT

An oscillator includes: a resonator; an oscillation circuit configured to generate an oscillation signal by the resonator; a clock output terminal; an output circuit configured to output a clock signal to an external processing device via the clock output terminal; a first terminal; and an interface circuit configured to execute communication with the processing device by a data signal. In the communication, the output circuit outputs the clock signal to the processing device that is a master for the communication, and the interface circuit that is a slave for the communication receives, via the first terminal, the data signal that is transmitted from the processing device and synchronized with the clock signal, or transmits, via the first terminal, the data signal to the processing apparatus in synchronization with the clock signal.

11 Claims, 16 Drawing Sheets

OSCILLATOR AND DEVICE

The present application is based on, and claims priority from JP Application Serial Number 2021-125125, filed Jul. 30, 2021, the disclosure of which is hereby incorporated by reference herein in its entirety.

BACKGROUND

1. Technical Field

The present disclosure relates to an oscillator, a device, and the like.

2. Related Art

JP-A-2008-250576 discloses an electronic circuit device capable of performing serial communication even when the number of external terminals is limited by asynchronous serial communication. Further, JP-A-2008-250576 discloses, as an electronic circuit device that can prevent erroneous recognition of start of the serial communication due to noise of a data signal, an electronic circuit device in which the serial communication is started upon detection of a burst signal input to an external terminal.

Since the electronic circuit device disclosed in JP-A-2008-250576 performs the asynchronous serial communication, the electronic circuit device may have a problem in serial communication due to noise.

SUMMARY

An aspect of the present disclosure relates to an oscillator including: a resonator; an oscillation circuit configured to generate an oscillation signal by the resonator; a clock output terminal; an output circuit configured to output a clock signal to an external processing device via the clock output terminal; a first terminal; and an interface circuit configured to execute communication with the processing device by a data signal. In the communication, the output circuit outputs the clock signal to the processing device that is a master for the communication, and the interface circuit that is a slave for the communication receives, via the first terminal, the data signal that is transmitted from the processing device and synchronized with the clock signal, or transmits, via the first terminal, the data signal to the processing apparatus in synchronization with the clock signal.

Another aspect of the present disclosure relates to a device including: a clock signal generation circuit configured to generate a clock signal; a clock output terminal; an output circuit configured to output the clock signal to an external processing device via the clock output terminal; a first terminal; and an interface circuit configured to execute communication with the processing device by a data signal. In the communication, the output circuit outputs the clock signal to the processing device that is a master for the communication, and the interface circuit that is a slave for the communication receives, via the first terminal, the data signal that is transmitted from the processing device and synchronized with the clock signal, or transmits, via the first terminal, the data signal to the processing apparatus in synchronization with the clock signal.

DESCRIPTION OF EXEMPLARY EMBODIMENTS

Hereinafter, an embodiment will be described. The present embodiment to be described below does not unduly limit contents of the claims. In addition, not all configurations described in the present embodiment are necessary elements.

1. Oscillator

Figure 1:
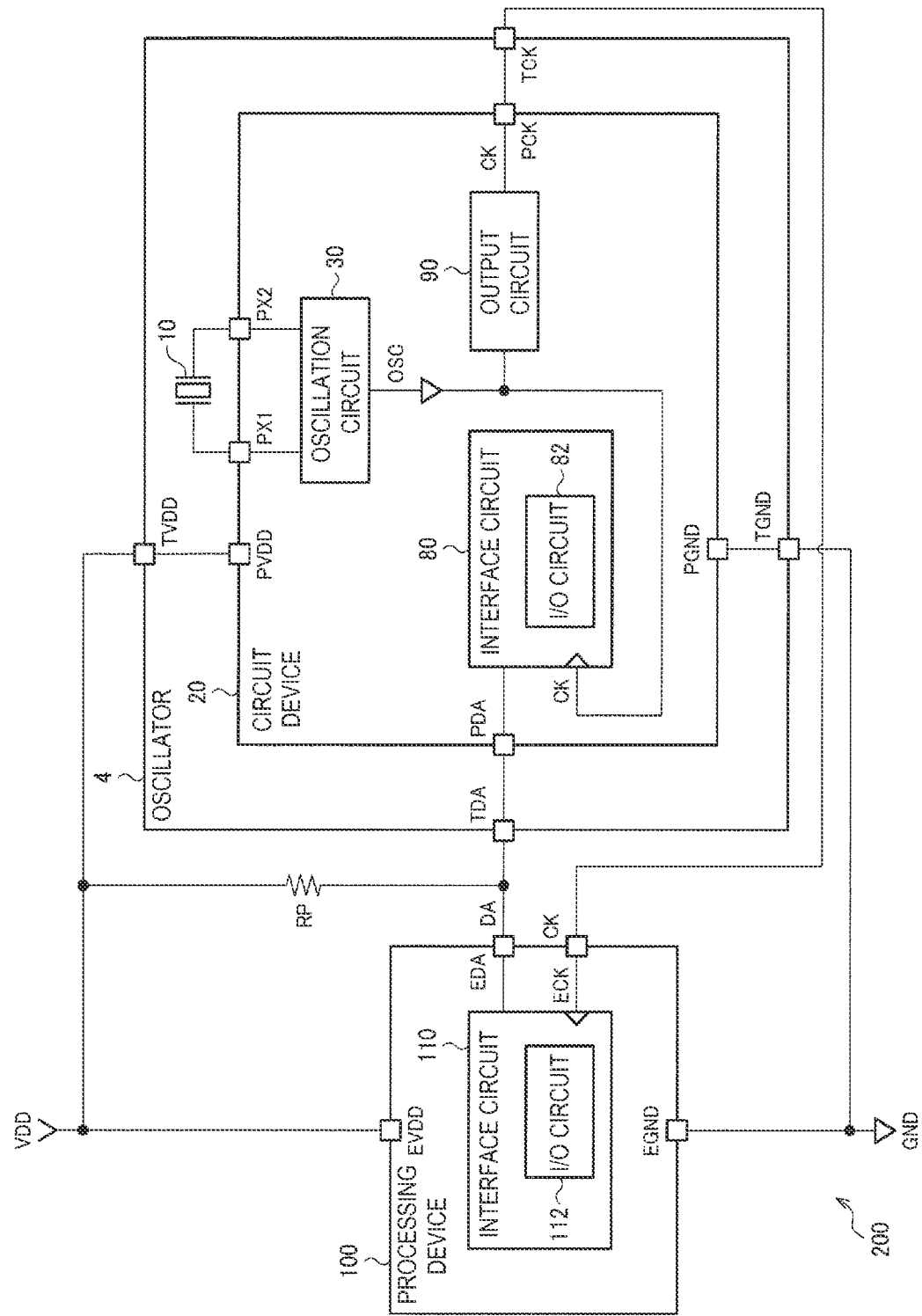
FIG. 1 shows a configuration example of an oscillator according to an embodiment.

FIG. 1 shows a configuration example of an oscillator 4 according to the present embodiment. FIG. 1 also shows a configuration example of a processing system 200 including the oscillator 4 and a processing device 100. The oscillator 4 is communicable with the processing device 100. The oscillator 4 includes a resonator 10 and a circuit device 20.

The resonator 10 is an element that generates mechanical oscillation by an electric signal. The resonator 10 may be implemented by a resonator element such as a crystal resonator element. For example, the resonator 10 may be implemented by a crystal resonator element that has a cut angle of AT cut, SC cut, or the like and that performs thickness-shear vibration, a tuning fork type crystal resonator element, or a double-tuning fork type crystal resonator element. For example, the resonator 10 may be a resonator provided in a temperature compensated crystal oscillator (TCXO) including no thermostatic bath, or a resonator provided in a oven controlled crystal oscillator (OCXO) including a oven. Alternatively, the resonator 10 may be a resonator provided in an oscillator of a simple packaged crystal oscillator (SPXO). The resonator 10 according to the present embodiment may be implemented by various resonator elements such as a resonator element other than a thickness-shear resonator element, a tuning fork type resonator element, and a double-tuning fork type resonator element, or a piezoelectric resonator element formed of a material other than a crystal. Examples of the resonator 10 may include a surface acoustic wave (SAW) resonator and a micro electro mechanical systems (MEMS) resonator that is a silicon resonator including a silicon substrate. The resonator 10 is electrically coupled to the circuit device 20. For example, the resonator 10 is electrically coupled to the circuit device 20 by an internal wiring of a package that houses the resonator 10 and the circuit device 20, a bonding wire, a metal bump, or the like.

The circuit device 20 generates and outputs a clock signal CK in the oscillator 4. The circuit device 20 can also perform data communication of a data signal DA. The circuit device 20 includes an oscillation circuit 30, an output circuit 90, and an interface circuit 80. The circuit device 20 is, for example, an integrated circuit (IC) manufactured by a semiconductor process, and is a semiconductor chip including circuit elements at a semiconductor substrate.

The oscillation circuit 30 oscillates the resonator 10. For example, the oscillation circuit 30 generates an oscillation signal OSC by oscillating the resonator 10. The oscillation signal OSC is an oscillation clock signal. As an example, the oscillation circuit 30 generates the oscillation signal OSC having a frequency of, for example, 32 KHz. The oscillation frequency is not limited to 32 KHz. For example, the oscillation circuit 30 may be implemented by a drive circuit for oscillation electrically coupled to one end and the other end of the resonator 10, and a passive element such as a capacitor or a resistor. The drive circuit may be implemented by, for example, a CMOS inverter circuit and a bipolar transistor. The drive circuit is a core circuit of the oscillation circuit 30, and oscillates the resonator 10 by driving the resonator 10 with a voltage or a current. Examples of the oscillation circuit 30 may include various types of oscillation circuits such as an inverter type oscillation circuit, a Pierce type oscillation circuit, a Colpitts type oscillation circuit, or a Hartley type oscillation circuit. The oscillation circuit 30 is electrically coupled to the resonator 10 via pads PX1 and PX2. The pads PX1 and PX2 couple the resonator. The drive circuit for oscillation of the oscillation circuit 30 is provided between the pad PX1 and the pad PX2. The coupling in the present embodiment is an electrical coupling. In the electrical coupling, an electric signal can be transmitted, and information can be transmitted by the electric signal. The electrical coupling may be performed via a passive element or the like.

The output circuit 90 outputs the clock signal CK based on the oscillation signal OSC. For example, the output circuit 90 buffers the oscillation signal OSC that is an oscillation clock signal output from the oscillation circuit 30, and outputs the oscillation signal OSC to a clock output pad PCK as the clock signal CK. Further, the clock signal CK is output to the outside via a clock output terminal TCK of the oscillator 4. For example, the output circuit 90 outputs the clock signal CK in a single-ended CMOS signal format. The output circuit 90 may output the clock signal CK in a signal format other than the CMOS.

The interface circuit 80 serves as an interface with the external processing device 100 or the like. The interface circuit 80 is, for example, a circuit that communicates with the external processing device 100 shown in FIG. 1. In the present embodiment, the data communication by the data signal DA synchronized with the clock signal CK is performed between the oscillator 4 and the processing device 100 in FIG. 1 via a first terminal TDA. Specifically, as will be described later with reference to FIGS. 9 and 10, temperature detection data DTD can be transmitted to the processing device 100 via the first terminal TDA, and frequency setting data DFS that sets an oscillation frequency generated by the oscillation circuit 30 can be received from the processing device 100 via the first terminal TDA. The interface circuit 80 may be implemented by, for example, a serial interface circuit that performs communication of a serial interface.

A power supply pad PVDD is supplied with a power supply voltage VDD. The pad is a terminal of the circuit device 20 that is a semiconductor chip. For example, in a pad region, a metal layer is exposed from a passivation film that is an insulating layer, and the exposed metal layer constitutes the pad that is the terminal of the circuit device 20. For example, the power supply voltage VDD from an external power supply device is supplied to the power supply pad PVDD. A ground pad PGND is a terminal to which GND that is a ground voltage is supplied. The GND may also be referred to as VSS, and the ground voltage is, for example, a ground potential. In the present embodiment, the ground is appropriately described as GND. The power supply pad PVDD, the ground pad PGND, the clock output pad PCK, and a first pad PDA are electrically coupled to a power supply terminal TVDD, a ground terminal TGND, the clock output terminal TCK, and the first terminal TDA that are external terminals for externally coupling the oscillator 4, respectively. For example, these pads and terminals are electrically coupled by the internal wiring of a package, a bonding wire, or a metal bump.

The processing system 200 shown in FIG. 1 includes the oscillator 4 and the processing device 100 electrically coupled to the oscillator 4. In addition, the processing system 200 may include, for example, a device that operates based on the clock signal CK of the oscillator 4. The oscillator 4 is electrically coupled to the processing device 100 via wiring or the like of a circuit board. The processing system 200 is assembled in, for example, electronic equipment. The electronic equipment is, for example, network-related equipment such as a base station or a router, high-precision measuring equipment that measures physical quantities such as distances, time, flow velocity, or flow rates, biometric information measuring equipment that measures biometric information, or in-vehicle equipment. In addition, the electronic equipment may be mesh network equipment of a sensor, internet of things (IoT) equipment, wearable equipment such as a head mounted display apparatus or watch-related equipment, a robot, a printing apparatus, a projection apparatus, a portable information terminal such as a smartphone, content providing equipment that distributes contents, or video equipment such as a digital camera or a video camera.

As described above, the processing device 100 communicates with the interface circuit 80 of the oscillator 4. Specifically, the processing device 100 includes an interface circuit 110, and communication is performed between the interface circuit 80 of the oscillator 4 and the interface circuit 110 of the processing device 100. The processing device 100 includes a data terminal EDA to and from which the data signal DA is input and output, a clock input terminal ECK to which the clock signal CK is input, a power supply terminal EVDD to which the VDD is supplied, and a ground terminal EGND to which the GND is supplied.

The processing device 100 may be implemented by, for example, a processor such as a microprocessor unit (MPU), a micro controller unit (MCU), or a central processing unit (CPU), or a circuit device such as an application specific integrated circuit (ASIC). For example, the processing device 100 that is an external device may include a circuit device, and a circuit board on which the circuit device is mounted.

The interface circuit 110 of the processing device 100 communicates with the interface circuit 80 of the oscillator 4 by the clock signal CK input to the clock input terminal ECK and the data signal DA input and output by the data terminal EDA. The output circuit 90 of the oscillator 4 that is a slave in the communication outputs the clock signal CK to the processing device 100 that is a master. A master in the communication refers to a device that controls or operates a plurality of equipment when the plurality of equipment operate in cooperation, and a slave refers to a device that operates under the control of the master. In the following description, the processing device 100 is simply referred to as the master, and the interface circuit 80 or the oscillator 4 is simply referred to as the slave. The master receives the clock signal CK and transmits the data signal DA synchronized with the received clock signal CK to the slave. Then, the slave receives the data signal DA synchronized with the clock signal CK via the first terminal TDA. Further, the slave transmits the data signal DA in synchronization with the clock signal CK, and the master receives the data signal DA from the slave based on the received clock signal CK. In this way, based on the clock signal CK output by the slave, the data communication synchronized with the clock signal CK is performed between the master and the slave.

As described above, the oscillator 4 according to the present embodiment includes: the oscillator 10; the oscillation circuit 30 that generates the oscillation signal OSC by the resonator 10; the clock output terminal TCK; the output circuit 90 that outputs the clock signal CK to the external processing device 100 via the clock output terminal TCK; the first terminal TDA; and the interface circuit 80 that executes communication with the processing device 100 by the data signal DA.

Further, in the communication, the output circuit 90 outputs the clock signal CK to the processing device 100 that is a master for the communication. That is, in normal, a master outputs a clock signal for the communication, whereas in the present embodiment, the output circuit 90 on a slave side outputs the clock signal CK. Further, the interface circuit 80 that is a slave for the communication receives the data signal DA, which is transmitted from the processing device 100 and synchronized with the clock signal CK, via the first terminal TDA. That is, the processing device 100 that is a master transmits the data signal DA in synchronization with the clock signal CK from a slave, and the interface circuit 80 that is a slave receives the transmitted data signal DA. Alternatively, the interface circuit 80 that is a slave for the communication transmits the data signal DA to the processing device 100 via the first terminal TDA in synchronization with the clock signal CK. That is, the interface circuit 80 that is a slave transmits the data signal DA in synchronization with the clock signal CK, and processing device 100 that is a master receives the transmitted data signal DA. In this way, based on the clock signal CK output from the slave side, synchronous communication by the data signal DA is possible between the processing device 100 that is a master for the communication and the interface circuit 80 that is a slave for the communication.

In addition, in FIG. 1, a pull-up resistor RP is provided between a data line of the data signal DA and a power supply line of the VDD. Accordingly, a data line coupling the processing device 100 and the interface circuit 80 is pulled up. That is, the data line is pulled up to a power supply voltage level of the VDD. In this way, when neither the interface circuit 80 nor the processing device 100 drives the data line to a low level, the data line is pulled up to a high level that is the power supply voltage level of the VDD. Specifically, when the interface circuit 80 includes an I/O circuit 82 including an open-drain N-type transistor TR shown in FIG. 5 to be described later and the interface circuit 110 includes an I/O circuit 112, the data line is pulled up to a high level when the transistor TR is turned off. Accordingly, serial data communication performed using the data line can be implemented.

In addition, in FIG. 1, the pull-up resistor RP is provided between the data line of the data signal DA and the power supply line of the VDD. Alternatively, the pull-up resistor RP may be not provided.

The oscillator 4 shown in FIG. 1 is a 4-terminal oscillator including the power supply terminal TVDD, the ground terminal TGND, the clock output terminal TCK, and the first terminal TDA. A problem how to implement the communication with the external processing device 100 occurs in the oscillator 4 having such a small number of terminals.

Figure 2:
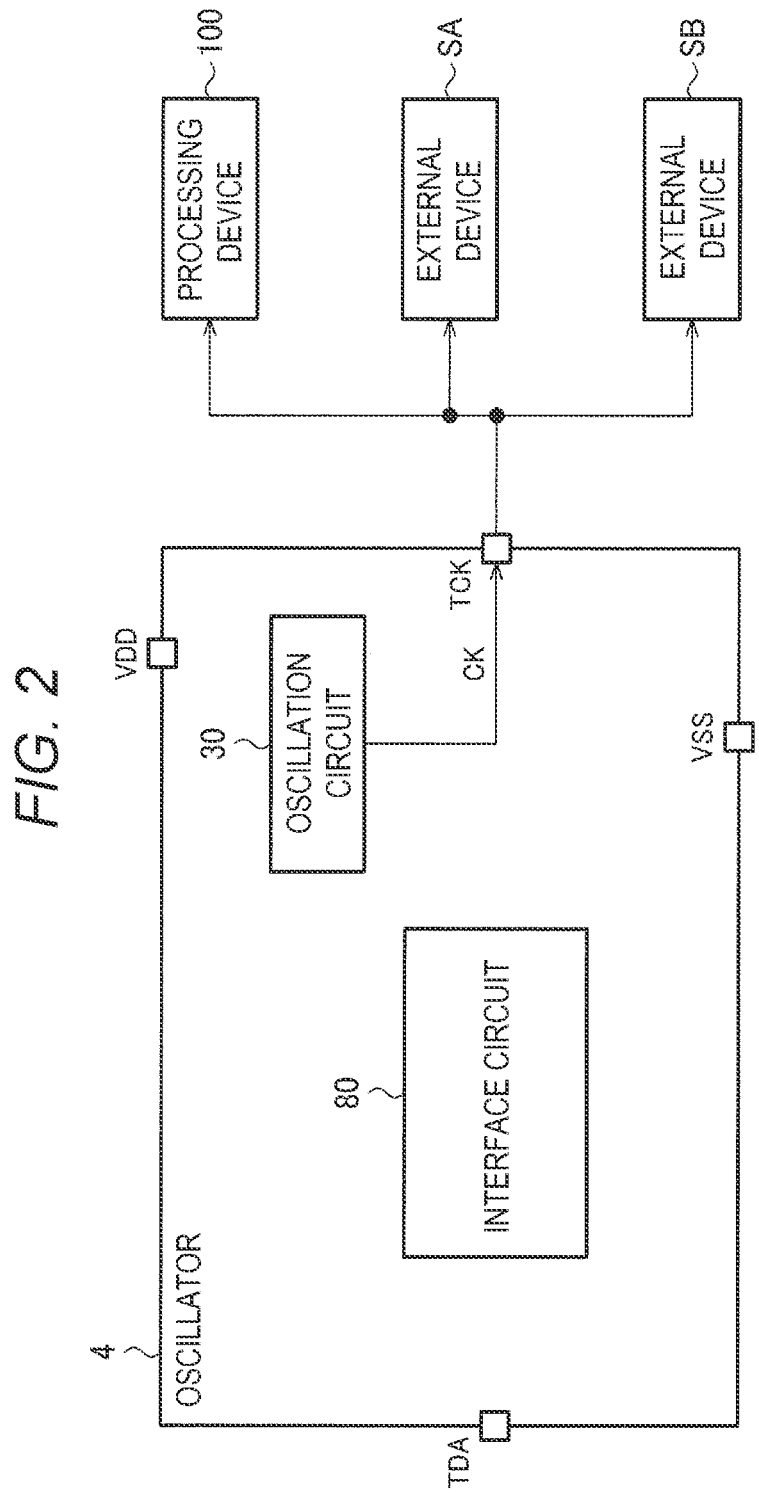
FIG. 2 is a schematic diagram of an oscillation mode according to a comparative example of the present embodiment.
Figure 3:
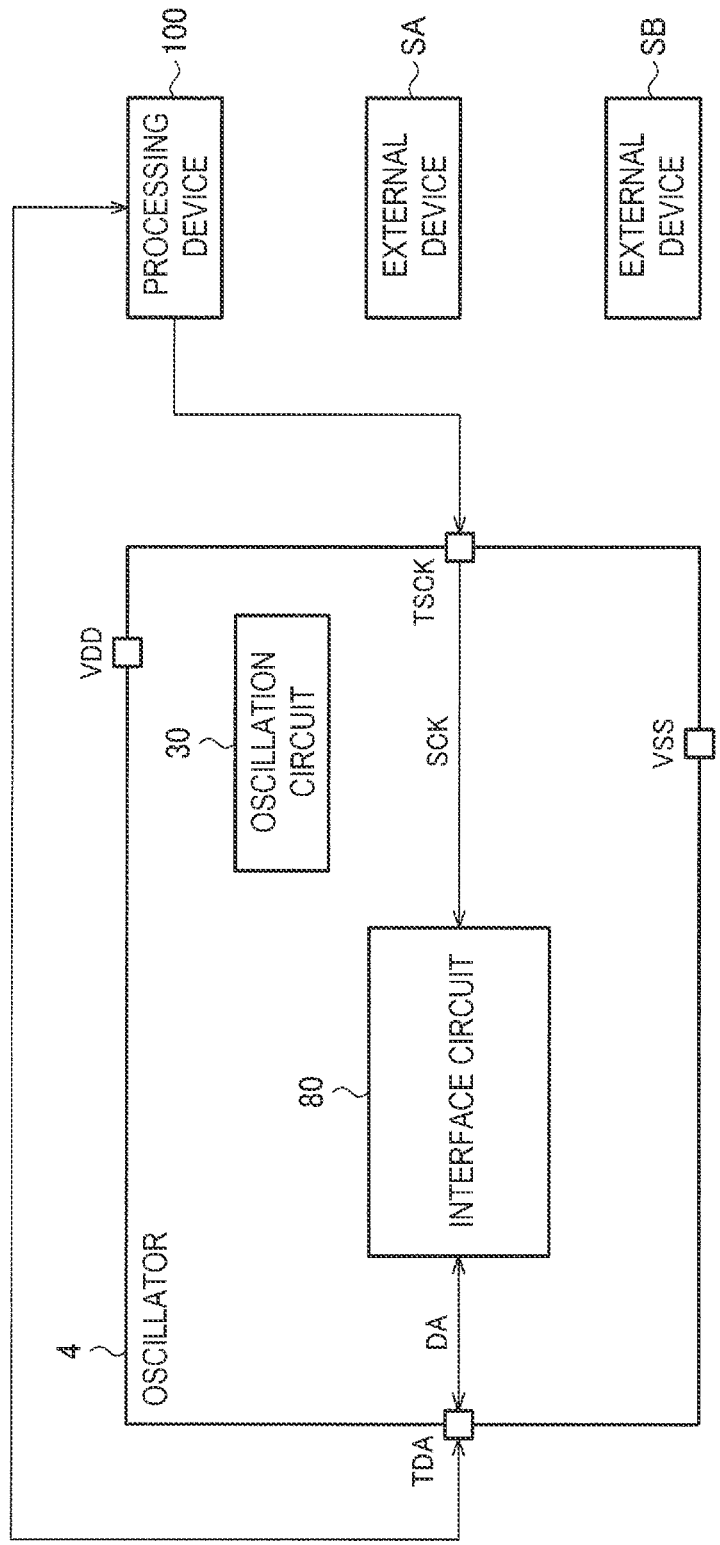
FIG. 3 is a schematic diagram of a communication mode according to the comparative example of the present embodiment.

For example, as a comparative example of FIG. 1, a method of switching an operation mode of the oscillator 4 between an oscillation mode and a communication mode is considered. For example, a method for implementing communication with the external processing device 100 even with a small number of terminals by switching the operation mode to the communication mode at the time of manufacturing and inspection is considered. FIGS. 2 and 3 show an outline of the comparative example.

FIG. 2 shows an operating state when the oscillator 4 is in the oscillation mode. In the oscillation mode, the clock signal CK based on the oscillation signal OSC of the oscillation circuit 30 is transmitted to the external processing device 100, an external device SA, and an external device SB via the clock output terminal TCK, and the processing device 100 or the like operates based on the clock signal CK. That is, based on the clock signal CK output from the oscillator 4 that is a slave, the processing device 100 that is a master, the external device SA, or the like operates.

FIG. 3 shows the operating state when the oscillator 4 is in the communication mode. In the communication mode, the clock output terminal TCK is switched to a serial clock input terminal TSCK for the communication, and the first terminal TDA that is an output enable terminal TOE is switched to a terminal for the data communication. In the communication mode, the oscillator 4 communicates with, for example, a serial interface of the processing device 100. Specifically, the oscillator 4 receives a serial clock signal SCK output by the processing device 100 via the serial clock input terminal TSCK, and the communication by the data signal DA is performed via the first terminal TDA switched to the terminal for the data communication. However, in the method of the comparative example, since the clock output terminal TCK is switched to the serial clock input terminal TSCK for the data communication in the communication mode, the clock signal CK of the oscillator 4 cannot be output from the clock output terminal TCK to, for example, the processing device 100. Therefore, when the processing device 100 operates based on the clock signal CK, or when there is the external device SA or the like that operates by the clock signal CK, the processing device 100, the external device SA, or the like cannot operate based on the clock signal CK in the communication mode. That is, in the communication mode, it is not possible to achieve both the data communication between the processing device 100 that is a master and the oscillator 4 that is a slave and continuation of the operating state of the processing device 100, the external device SA, or the like that operates based on the clock signal CK.

Figure 4:
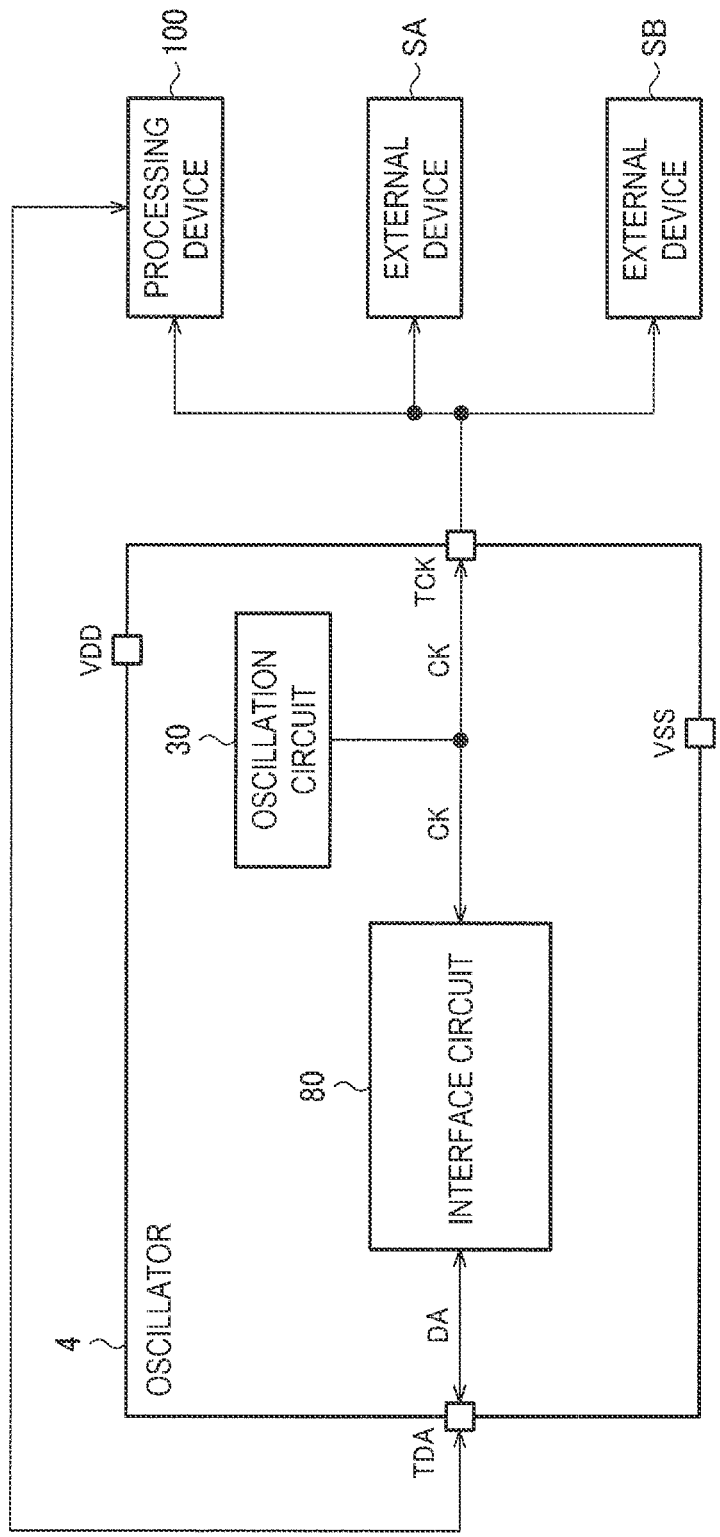
FIG. 4 is a schematic diagram of a communication mode according to the present embodiment.

FIG. 4 shows a communication state when the present embodiment of FIG. 1 is applied. As described above, according to a configuration of the present embodiment, the data communication is performed between the processing device 100 that is a master and the oscillator 4 that is a slave by the clock signal CK output by the oscillator 4 that is a slave. Therefore, it is not necessary to set the operating state to the communication mode and switch the clock output terminal TCK to the serial clock input terminal TSCK for the data communication as in the method of the above comparative example. Therefore, the oscillator 4 can output the clock signal CK from the clock output terminal TCK to the processing device 100, the external device SA, or the like, and at the same time, can perform the data communication synchronized with the clock signal CK with the processing device 100. Therefore, it is possible to implement both the data communication between the processing device 100 that is a master and the oscillator 4 that is a slave and maintenance of the operating state of the processing device 100, the external device SA, or the like that operates based on the clock signal CK.

Further, in the present embodiment, since the oscillator 4 that is a slave continuously outputs the clock signal CK, power consumption can be kept constant. This leads to the oscillator 4 outputting the clock signal CK having a more stable frequency. That is, when the oscillator 4 continuously outputs the clock signal CK, an amount of heat generated by the oscillator 4 is constant, and heat relationship between the oscillator 4 and the outside is kept constant. However, when the oscillator 4 interrupts output of the clock signal CK, the heat relationship between the oscillator 4 and the outside changes, and the temperature of the oscillator 4 cannot be kept constant. When the temperature of the oscillator 4 varies, it is necessary to correct the temperature by a temperature compensation circuit 60 in FIG. 9 to be described later, which affects generation of the clock signal CK having a stable frequency. Therefore, a frequency of the clock signal CK varies, and a clock frequency characteristic of the oscillator 4 deteriorates. Therefore, according to the present embodiment, the oscillator 4 continuously outputs the clock signal CK, so that the clock signal CK having a stable frequency can be output. Accordingly, while enabling the data communication between the oscillator 4 and the processing device 100, it is possible to continuously supply the clock signal CK having a high quality frequency characteristic to the processing device 100 and the external device SA.

For example, in the serial data communication, it is general that a master outputs the serial clock signal SCK used for the data communication to a slave as shown in FIG. 3. The master outputs the serial clock signal SCK to the slave during a communication period in which the data communication is performed. In a period other than the communication period, the serial clock signal SCK that synchronizes the data communication with a slave is unnecessary in order to prevent wasteful power consumption. The communication period is specifically a period during which the data signal DA is written from a master to a slave or the data signal DA is read from a slave. On the other hand, in the present embodiment, a slave plays a role of outputting the clock signal CK on behalf of a master in the data communication. Unlike the master, in order to maintain the operating state of the external device SA or the like provided in the processing system 200, the slave needs to continuously output the clock signal CK even during a period in which the data communication between the slave and the master is not performed. In this way, in the present embodiment, the oscillator 4 that is a slave includes the output circuit 90 that outputs the clock signal CK even in a period other than a period of the data communication.

In addition, the oscillator 4 according to the present embodiment includes 4 terminals including the power supply terminal TVDD, the ground terminal TGND, the clock output terminal TCK, and the first terminal TDA, as external terminals for external coupling of the oscillator 4. For example, the power supply voltage VDD from the external power supply device is supplied to the power supply terminal TVDD. The GND that is a ground voltage is supplied to the ground terminal TGND. The ground voltage GND is, for example, a ground potential. The clock output terminal TCK is a terminal used to output the clock signal CK generated by the output circuit 90 to the outside. The first terminal TDA is a terminal used by the oscillator 4 and is a slave to perform the data communication with a master.

In addition, as described above, the power supply terminal TVDD, the ground terminal TGND, the clock output terminal TCK, and the first terminal TDA of the oscillator 4 are electrically coupled to the power supply pad PVDD, the ground pad PGND, the clock output pad PCK, and the first pad PDA of the circuit device 20, respectively.

According to the present embodiment, in the oscillator 4 in which the number of external terminals is limited to only 4, regardless of whether the data communication is being performed between the processing device 100 and the oscillator 4, the oscillator 4 can continuously output the accurate clock signal CK to the processing device 100, the external device SA, or the like.

In addition, in the oscillator 4 according to the present embodiment, the first terminal TDA may be the output enable terminal TOE that switches enabling or disabling of the output of the clock signal CK.

When the first terminal TDA is used as the output enable terminal TOE and is set to an active level such as a high level, the output circuit 90 outputs the clock signal CK to the outside. On the other hand, when the first terminal TDA is set to an inactive level such as a low level, the output circuit 90 sets, for example, the clock signal CK to a fixed voltage level such as a low level. In this way, the first terminal TDA can also function not only as a terminal that transmits and receives a data signal, but also as a terminal that controls on and off of the output of the clock signal of the oscillator.

Figure 5:
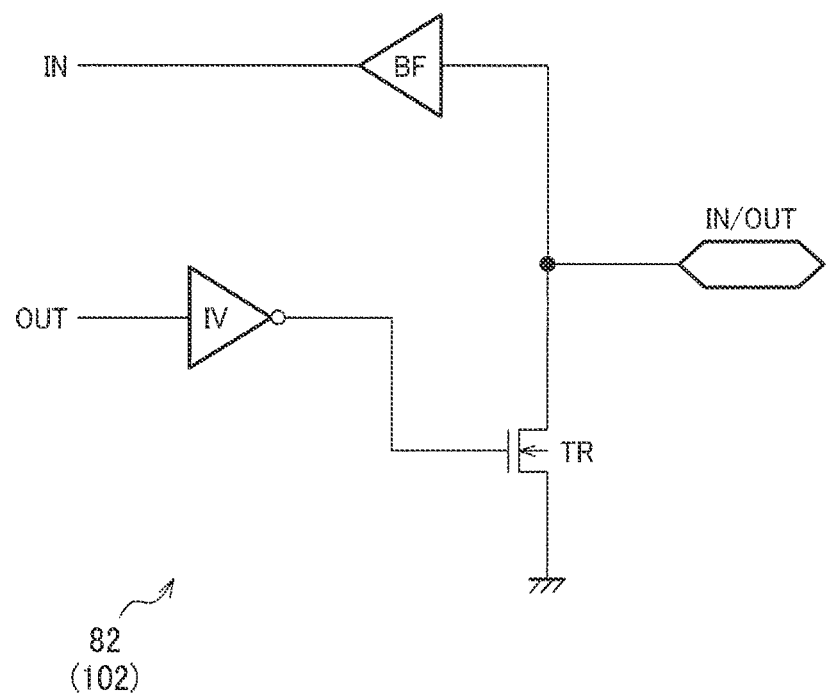
FIG. 5 shows a configuration example of an I/O circuit of an interface circuit.

FIG. 5 shows a configuration example of the I/O circuit 82 provided in the interface circuit 80 in FIG. 1. The I/O circuit 82 includes the open-drain N-type transistor TR and an input buffer BF. An IN/OUT terminal in FIG. 5 corresponds to the first terminal TDA in FIG. 1. The first terminal TDA corresponds to a data terminal of the oscillator 4.

An output signal OUT from an internal circuit is buffered by, for example, an inverter IV and input to a gate of the transistor TR. For example, when the output signal OUT is at a low level and the gate of the transistor TR is at a high level, the transistor TR is turned on and the data line is driven to a low level. On the other hand, when the output signal OUT is at a high level and the gate of the transistor TR is at a low level, the transistor TR is turned off. In this case, the data line is pulled up to a high level by the resistor RP in FIG. 1. Accordingly, the data signal DA can be transmitted using the output signal OUT. The IN/OUT terminal is coupled to the input buffer BF, and an input signal IN of the IN/OUT terminal is buffered by the input buffer BF and input into the internal circuit. Accordingly, the data signal DA using the input signal IN can be received.

When the pulling-up resistor RP in FIG. 1 is not provided, the I/O circuit 82 in FIG. 5 may be provided with, instead of the open-drain N-type transistor TR, for example, a push-pull output circuit including a P-type transistor and an N-type transistor provided in series between the VDD and the GND.

The I/O circuit 112 provided in the interface circuit 110 of the processing device 100 has the same configuration as the I/O circuit 82 in FIG. 5.

Figure 6:
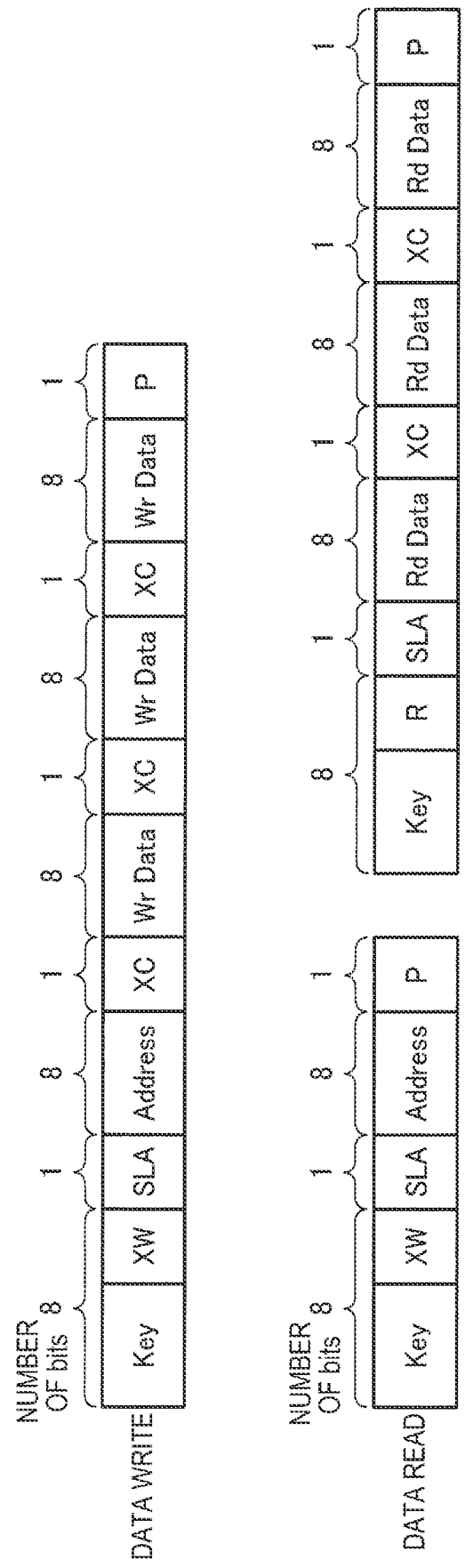
FIG. 6 is a schematic diagram of an example of a communication protocol according to the present embodiment.

Hereinafter, the data communication performed between the master and the slave in the processing system 200 according to the present embodiment will be described. FIG. 6 is a schematic diagram of an example of a communication protocol according to the present embodiment. An upper figure of FIG. 6 shows a communication protocol of data writing, and a lower figure of FIG. 6 shows a communication protocol of data reading. In the communication protocol of the data writing, the master transmits a communication start key, and the interface circuit 80 that is a slave receives the communication start key. In this case, the master transmits the communication start key in synchronization with the clock signal CK from the slave. Further, the interface circuit 80 that is a slave receives the communication start key synchronized with the clock signal CK, determines whether the received communication start key is a key of an appropriate code according to the protocol, and determines that communication is started when the received communication start key is the key of an appropriate code. In the communication protocol such as data reading, it is determined that communication is started by the same procedure. In this way, in the present embodiment, the interface circuit 80 starts the communication on condition that the communication start key is received from the processing device 100. In this way, the communication between the master and the slave is started on condition that the communication start key of an appropriate code is transmitted from the master to the slave, and it is possible to prevent erroneous determination of start of the communication due to noise or the like included in the data signal.

Figure 7:
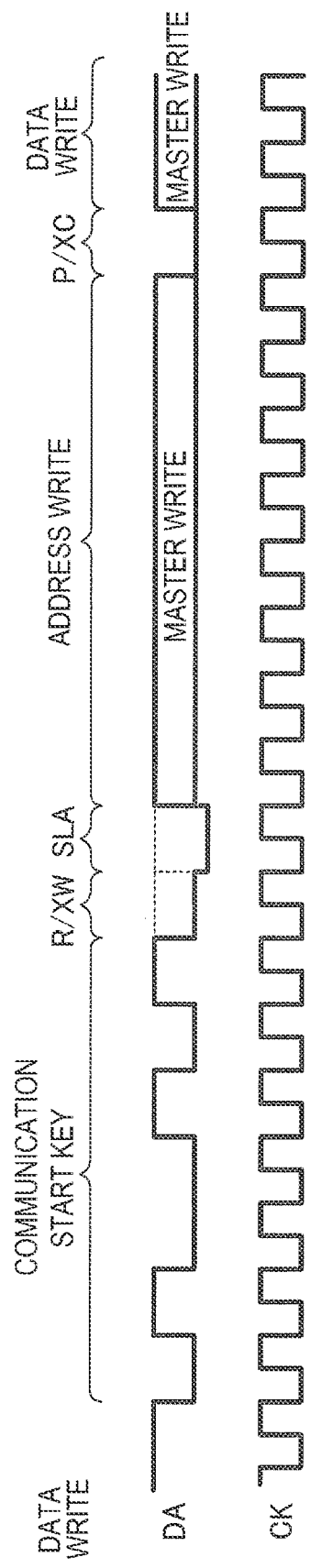
FIG. 7 is a signal waveform diagram showing a communication example according to the present embodiment.
Figure 8:
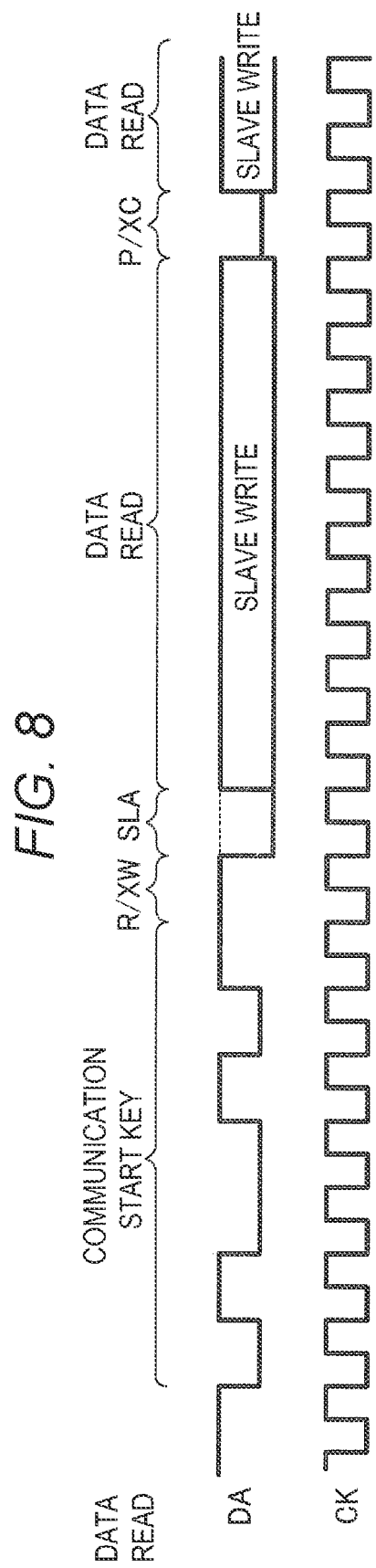
FIG. 8 is a signal waveform diagram showing a communication example according to the present embodiment.

FIGS. 7 and 8 are signal waveform diagrams showing communication examples according to the present embodiment. FIG. 7 is a signal waveform diagram of data writing in which the master writes data to the slave. The data writing by the master corresponds to data reception by the interface circuit 80 that is a slave. FIG. 8 is a signal waveform diagram of data reading in which the master reads data from the slave. The data reading by the master corresponds to data transmission by the interface circuit 80 that is a slave. In addition, in FIGS. 7 and 8, in order to distinguish a case in which the master outputs a low level and a case in which the slave outputs a low level, the low level output by the slave is schematically shown as a potential lower than the low level output by the master.

In the data writing in FIG. 7, the master outputs R/XW specifying the data writing or the data reading after the master transmits the communication start key. In the R/XW, X means a negative logic, and the master outputs a high level for the data reading, and outputs a low level for the data writing. Since it is the data writing in FIG. 7, the master output a low level as XW in the R/XW. That is, when the open-drain N-type transistor of the I/O circuit 112 on a master side in FIG. 5 is turned on, a low level is output. In this way, when the master outputs a low level after the communication start key is transmitted, the slave outputs an SLA indicating acknowledge of a slave. Specifically, the slave outputs a low level as the SLA. As described above, in order to distinguish a low level output by the slave from a low level output by the master, the low level output by the slave is schematically described as a low level having a low potential in FIG. 7.

When the slave outputs a low level as the SLA in this way, the master writes an address to the slave. The address specifies a register of the slave to which data is written. In the address write, the master transmits address information as the data signal DA, and the slave receives the address information.

The master outputs P/XC after the address write. In P/XC, P means stop, that is, stopping the communication, and XC means continue, that is, continuing the communication. X in XC means a negative logic. In FIG. 7, in order to continue the communication, the master outputs a low level as XC in the P/XC. Further, the master transmits data to be written to an address specified by the address write as the data signal DA. Accordingly, data from the master is written to a register of the specified address among registers of the oscillator 4. The write address is automatically updated in the slave. Therefore, as long as the slave outputs XC indicating continuation of communication, the data is sequentially written to the updated address. In FIGS. 6 and 7, data transmitted at once is shown as 8 bits, and may also be data of a predetermined number of bits such as 4 bits and 16 bits. Further, when there is no data to be written next, the master outputs a 1-bit P that instructs to stop the communication, and ends communication of the data writing.

Also in the data reading in FIG. 8, the master first transmits the communication start key, and the slave receives the communication start key. In the data reading, as shown in the lower part of FIG. 6, first, communication for designating information on an address where data to be read is written is performed in a write operation mode. That is, the master transmits an XW signal indicating the write operation mode after the communication start key is transmitted. Further, the slave outputs the SLA indicating acknowledge. Specifically, the slave outputs a low level as the SLA. The master that received an SLA signal transmits information on a specified address to the slave. The slave that received the address information outputs the 1-bit P that instructs to stop the communication, and temporarily stops the communication in a write mode. FIG. 8 shows a waveform of the data communication that is subsequently performed between the master and the slave. The master transmits the communication start key again, and then outputs a high level as R indicating reading. The slave that received an R signal outputs the SLA indicating acknowledge. After that, the slave reads information written in the specified address and transmits the information to the master. Further, the XC that means continuation of communication is transmitted from the master. The address to be read is automatically updated in the slave. Therefore, as long as the master outputs the XC indicating continuation of the communication, the slave sequentially reads data at the next address and transmits the data to the master. In addition, in FIGS. 6 and 8, the data transmitted at once is shown as 8 bits, and may be data of a predetermined number of bits such as 4 bits and 16 bits. Further, when there is no data to be read next, the master outputs the 1-bit P that instructs to stop the communication, and ends communication of the data reading.

In this way, in the present embodiment, at the time of the data writing in FIGS. 6 and 7, after receiving first data of a predetermined number of bits, the interface circuit 80 determines that the communication is continued when the processing device 100 outputs a low level, and receives next second data of the predetermined number of bits. That is, in the data writing by the master in FIGS. 6 and 7, the interface circuit 80 that is a slave receives the first data of 8 bits that is the predetermined number of bits. Specifically, the first data transmitted by the master is received and written into the register. In addition, the predetermined number of bits is not limited to 8 bits, and may be 16 bits, 32 bits, or the like. Further, when the processing device 100 outputs a low level as the XC that instructs to continue the communication after the first data is transmitted, the interface circuit 80 determines that the communication is continued. Further, when the processing device 100 outputs a low level as XC and then transmits the second data, the interface circuit 80 receives the transmitted second data, and the received second data is written into the register. In this way, after receiving the first data, the interface circuit 80 can determine whether the communication is continued by detecting whether the processing device 100 outputs a low level, and can receive the next second data. Accordingly, the interface circuit 80 can continuously receive a plurality of pieces of data of a predetermined number of bits, such as the first data and the second data. When the processing device 100 does not output a low level after the first data is transmitted, as shown in FIG. 5, since the data line is pulled up by the resistor RP to be set to a high level, the interface circuit 80 can determine that the communication does not continue and is stopped.

In the present embodiment, at the time of the data reading in FIGS. 6 and 8, after transmitting the first data of a predetermined number of bits, the interface circuit 80 determines that the communication is continued when the processing device 100 outputs a low level, and transmits the next second data of the predetermined number of bits. That is, in the data reading by the master in FIGS. 6 and 8, the interface circuit 80 that is a slave transmits the first data of 8 bits that is the predetermined number of bits. Then, when the processing device 100 outputs a low level as the XC that instructs to continue the communication, the interface circuit 80 determines that the communication is continued and transmits the next second data. In this way, after transmitting the first data, the interface circuit 80 can determine whether the communication is continued by detecting whether the processing device 100 outputs a low level, and can transmit the next second data. Accordingly, the interface circuit 80 can continuously transmit a plurality of pieces of data of a predetermined number of bits, such as the first data and the second data. When the processing device 100 does not output a low level after the first data is transmitted by the interface circuit 80, since the data line is pulled up by the resistor RP to be set to a high level, the interface circuit 80 can determine that the communication does not continue and is stopped.

2. Detailed Configuration Examples

Figure 9:
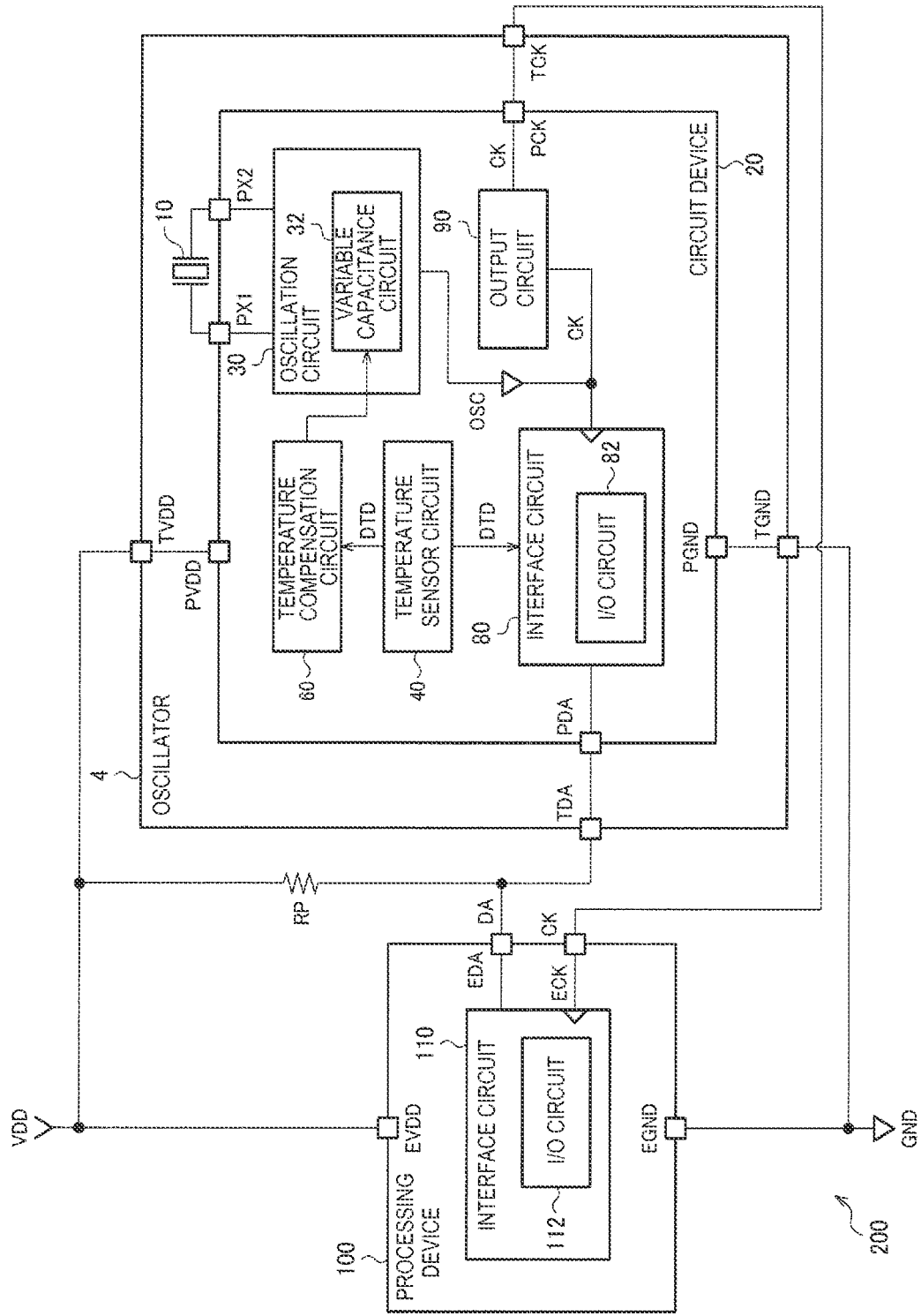
FIG. 9 shows a detailed first configuration example of the oscillator according to the present embodiment.

FIG. 9 is a detailed first configuration example of the oscillator 4 according to the present embodiment. In addition to the configuration of FIG. 1, the oscillator 4 of the detailed first configuration example includes a temperature sensor circuit 40 and the temperature compensation circuit 60.

The temperature sensor circuit 40 measures temperature such as the environmental temperature of the resonator 10 or the circuit device 20, and outputs a result of the measurement as the temperature detection data DTD. The temperature detection data DTD specifies the detected temperature and is associated with the detected temperature. The temperature detection data DTD, for example, monotonically increases or monotonically decreases with respect to the temperature in an operation temperature range of the oscillator 4. The temperature sensor circuit 40 may be implemented by, for example, a temperature sensor circuit using temperature dependence of an oscillation frequency of a ring oscillator. Specifically, the temperature sensor circuit 40 includes a ring oscillator and a counter. The counter counts an output pulse signal that is an oscillation signal of the ring oscillator in a count period defined by the clock signal CK based on the oscillation signal OSC from the oscillation circuit 30, and outputs a count value as the temperature detection data DTD. The temperature sensor circuit 40 is not limited thereto, and may include an analog temperature sensor that outputs a temperature detection voltage by temperature dependence of a forward voltage of a PN junction, and an A/D conversion circuit that performs A/D conversion on the temperature detection voltage and that outputs the temperature detection data DTD.

The temperature compensation circuit 60 performs a temperature compensation process based on the temperature detection data DTD from the temperature sensor circuit 40. The temperature compensation process is, for example, a process of reducing and compensating a variation of the oscillation frequency due to a temperature variation. That is, the temperature compensation circuit 60 performs the temperature compensation process of the oscillation frequency of the oscillation circuit 30 so that a frequency is constant even when the temperature variation occurs. Specifically, the temperature compensation circuit 60 performs the temperature compensation process based on a digital calculation performed using the temperature detection data DTD from the temperature sensor circuit 40.

Further, in the present embodiment, the oscillation circuit 30 includes a variable capacitance circuit 32. The oscillation circuit 30 can adjust the oscillation frequency by adjusting a capacitance of the variable capacitance circuit 32. The variable capacitance circuit 32 includes, for example, a capacitor array and a switch array coupled to the capacitor array. The variable capacitance circuit 32 may be implemented by a variable capacitance element such as a varactor. Switches of the switch array of the variable capacitance circuit 32 are turned on and off based on frequency adjustment data from the temperature compensation circuit 60. For example, the variable capacitance circuit 32 includes a first capacitor array having a plurality of capacitors whose capacitance values are binary weighted. In addition, the variable capacitance circuit 32 includes a first switch array including a plurality of switches in which the switches turn on and off coupling between the capacitors of the first capacitor array and the pad PX1. Examples of the variable capacitance circuit 32 include a first variable capacitance circuit and a second variable capacitance circuit. The first variable capacitance circuit includes the first capacitor array and the first switch array and is coupled to the pad PX1, and the second variable capacitance circuit includes a second capacitance array and a second switch array and is coupled to the pad PX2. Switches of the first switch array and the second switch array are turned on and off based on the frequency adjustment data.

That is, in the detailed first configuration example shown in FIG. 9, the temperature sensor circuit 40 measures the temperature such as the environmental temperature of the resonator 10 or the circuit device 20, and outputs the result of the measurement as the temperature detection data DTD to the temperature compensation circuit 60 and the interface circuit 80. Further, the temperature compensation circuit 60 reduces and compensates a variation of the oscillation frequency of the oscillation signal OSC due to the temperature variation based on the temperature detection data DTD received from the temperature sensor circuit 40. Specifically, the frequency adjustment data is obtained based on the temperature detection data DTD, and a capacitance value of the variable capacitance circuit 32 of the oscillation circuit 30 is adjusted based on the obtained frequency adjustment data. In this way, in the oscillator 4 according to the present embodiment, the temperature compensation process of the oscillation frequency output by the oscillation circuit 30 is possible.

The interface circuit 80 transmits the temperature detection data DTD as the data signal DA to the external processing device 100 via the first terminal TDA. Specifically, the processing device 100 includes the interface circuit 110, and the interface circuit 110 receives the temperature detection data DTD. In this way, in the oscillator 4 according to the present embodiment, the temperature detection data DTD is transmitted from the interface circuit 80 to the external processing device 100 via the first terminal TDA. Accordingly, it is possible to measure the temperature corresponding to the temperature detection data DTD.

As an application example of the detailed first configuration example shown in FIG. 9, for example, an example is considered in which the clock signal CK of 32 KHz from the oscillator 4 is supplied to a circuit of an RTC of the processing device 100 such as a microcomputer to implement a time counting process of a calendar in the RTC. In this case, since the time counting process of the calendar is required to be executed without stopping, the clock signal CK from the oscillator 4 is required to be constantly supplied to the circuit of the RTC of the processing device 100. On the other hand, the processing device 100 may, for example, detect an environmental temperature and perform a warning notification process when the temperature exceeds an upper limit or falls below a lower limit, while performing the time counting process of the calendar. In this case, the processing device 100 can execute the warning notification process by effectively using the temperature detection data DTD of the temperature sensor circuit 40 of the oscillator 4 and detecting the temperature based on the temperature detection data DTD output from the oscillator 4 via the interface circuit 80. In such a case, according to the configuration in FIG. 9, since the temperature detection data DTD from the oscillator 4 can be transmitted to the processing device 100 and the clock signal CK of the oscillator 4 can be continuously supplied at the same time to the circuit of the RTC of the processing device 100 during the period of the data communication and other periods, the time counting process of the calendar can be implemented. That is, the processing device 100 can execute both temperature detection based on the temperature detection data DTD and the time counting process of the calendar based on the clock signal CK.

Figure 10:
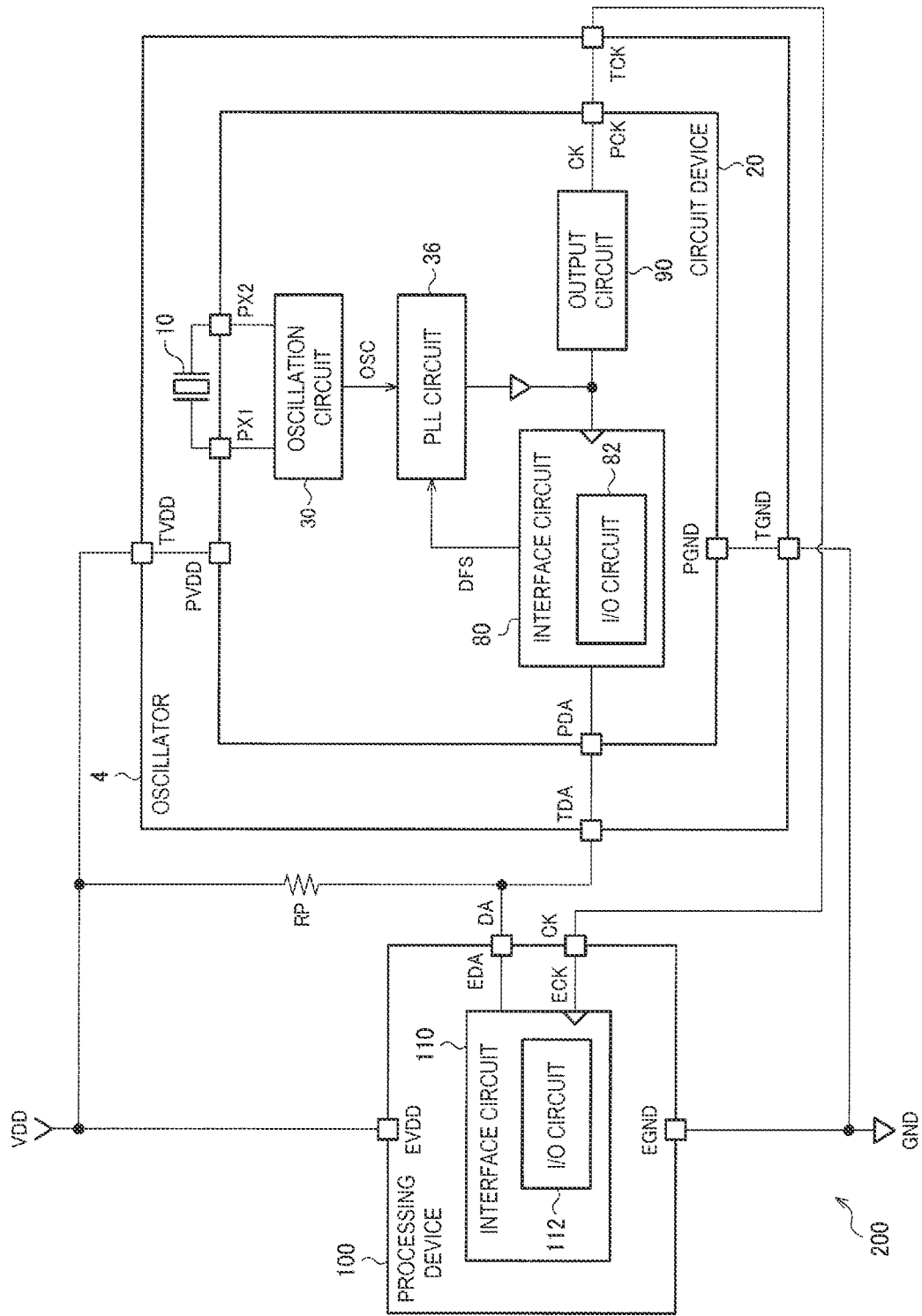
FIG. 10 shows a detailed second configuration example of the oscillator according to the present embodiment.

FIG. 10 is a detailed second configuration example of the oscillator 4 according to the present embodiment. The oscillator 4 of the second detailed configuration example includes a PLL circuit 36 in addition to the configuration of FIG. 1.

The PLL circuit 36 generates the clock signal CK having a frequency obtained by multiplying a frequency of the oscillation signal OSC that is a reference clock signal. Specifically, the PLL circuit 36 includes a voltage-controlled oscillation circuit, performs phase comparison between the oscillation signal OSC that is a reference clock signal and a feedback clock signal, and generates the clock signal CK having the multiplied frequency. For example, a fractional-N type PLL circuit capable of fractionally multiplying a frequency may be used as the PLL circuit 36.

The PLL circuit 36 is provided between the oscillation circuit 30 and the output circuit 90. First, the frequency setting data DFS transmitted by the processing device 100 that is a master is received by the interface circuit 80 that is a slave via the first terminal TDA. The frequency setting data DFS includes information for setting the clock frequency of the clock signal CK output by the oscillator 4, and content of the data can be set in the processing device 100. Next, the frequency setting data DFS received by the interface circuit 80 is set in the PLL circuit 36. For example, a control circuit (not shown) sets the frequency setting data DFS in the PLL circuit 36. In the PLL circuit 36, a process of generating the clock signal CK having a predetermined frequency is performed based on the frequency setting data DFS. The clock signal CK generated by the PLL circuit 36 is input to the output circuit 90 and the interface circuit 80. The output circuit 90 outputs the clock signal CK to the processing device 100 via the clock output terminal TCK, and the clock signal CK is used as an operating clock of the processing device 100. Alternatively, the clock signal CK is also used as an operating clock for the external device SA or the like. The clock signal CK is also used as a serial clock signal used for the serial data communication performed between the master and the slave. That is, according to the detailed second configuration example of the present embodiment, the frequency of the clock signal CK output by the oscillator 4 can be set to a desired frequency by using the frequency setting data DFS, and clock signal CKs having various frequencies required for the processing device 100, the external device SA, or the like can be generated.

For example, when the frequency of the clock signal CK is set to be high by the configuration as shown in FIG. 10, communication between the processing device 100 and the oscillator 4 is performed using the clock signal CK having a high frequency, and thus proper communication may fail to be implemented. In such a case, for example, a method described with reference to FIG. 11 may be adopted.

Figure 11:
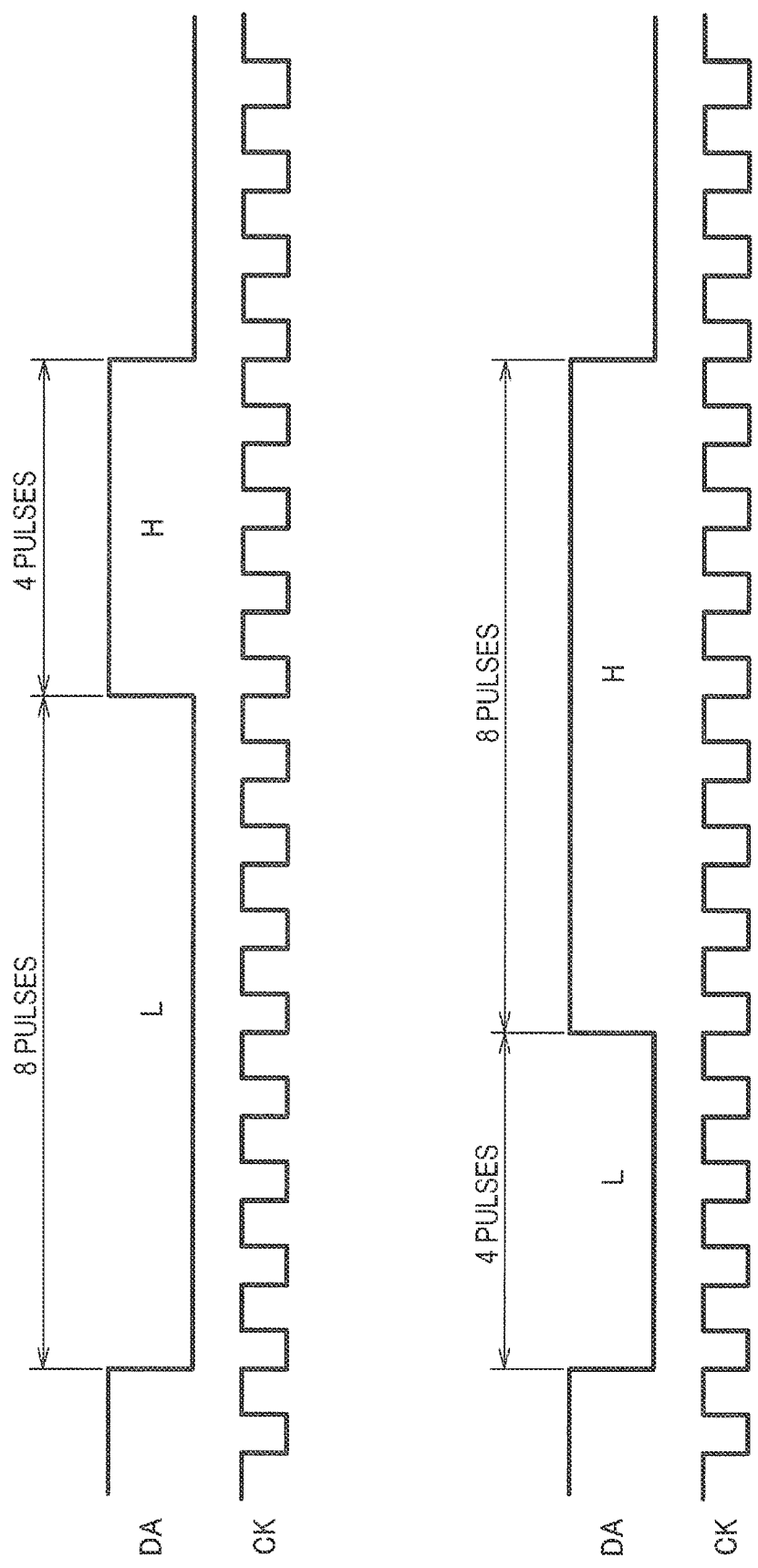
FIG. 11 shows an example of a bit pattern showing logic levels "0" and "1".

For example, FIG. 11 shows waveforms of a predetermined bit pattern defined by logic levels "0" and "1", respectively. An upper waveform pattern of FIG. 11 is, for example, a waveform pattern corresponding to the logic level "0", and a lower waveform pattern of FIG. 11 is, for example, a waveform pattern corresponding to the logic level "1". The waveform pattern corresponding to the logic level "0" is, for example, a pattern in which a low-level data signal DA for an 8-clock period of the clock signal CK is output, and then a high-level data signal DA for a 4-clock period of the clock signal CK is output. The waveform pattern corresponding to the logic level "1" is, for example, a pattern in which the low-level data signal DA for a 4-clock period of the clock signal CK is output, and then the high-level data signal DA for an 8-clock period of the clock signal CK is output. That is, the logic levels "0" and "1" are determined by determining a ratio between a low-level pulse length and a high-level pulse length. In addition, when n is an integer of 1 or more, an n-clock period is a period as long as the number of n clocks of the clock signal CK.

For example, in FIGS. 7 and 8, a 1-bit communication period is a 1-clock period, which is a period as long as one clock. When the frequency of the clock signal CK is low such as 32 kHz, communication can be performed without any problem even when the 1-bit communication period is the 1-clock period. However, when the frequency of the clock signal CK is, for example, high such as several MHz to tens of MHz, the 1-clock period is shortened and the 1-bit communication period is shortened, and a communication error occurs. For example, such a communication error occurs that the slave fails to receive 1-bit information transmitted by the master, or the master fails to receive 1-bit information transmitted by the slave. In such a case, when the logic level of the bit is "0", information is communicated by, for example, the upper waveform pattern of FIG. 11, and when the logic level of the bit is "1", information is communicated by, for example, the lower waveform pattern of FIG. 11. In this way, it is possible to prevent the communication error such as the slave failing to receive the 1-bit information transmitted by the master or the master failing to receive the 1-bit information transmitted by the slave. Accordingly, stable communication with high reliability between the master and the slave can be implemented.

The oscillator 4 in the present embodiment may output the clock signal CK having a frequency higher than a frequency at which serial communication is possible. For example, as shown in FIG. 10, the oscillator 4 outputs the clock signal CK having a frequency obtained by multiplying the frequency of the oscillation signal of the oscillation circuit 30 by the PLL circuit 36. In this way, when the frequency of the clock signal CK output by the oscillator 4 is high, it is effective to define a predetermined waveform pattern corresponding to the logic levels "0" and "1" and perform communication as shown in FIG. 11.

In the above description, the number of external terminals of the oscillator 4 is 4. Alternatively, the number of external terminals of the oscillator 4 is not limited to 4, and may be 5 or more. For example, a case where the number of external terminals of the oscillator 4 is 6 will be described with reference to FIGS. 12 and 13.

Figure 12:
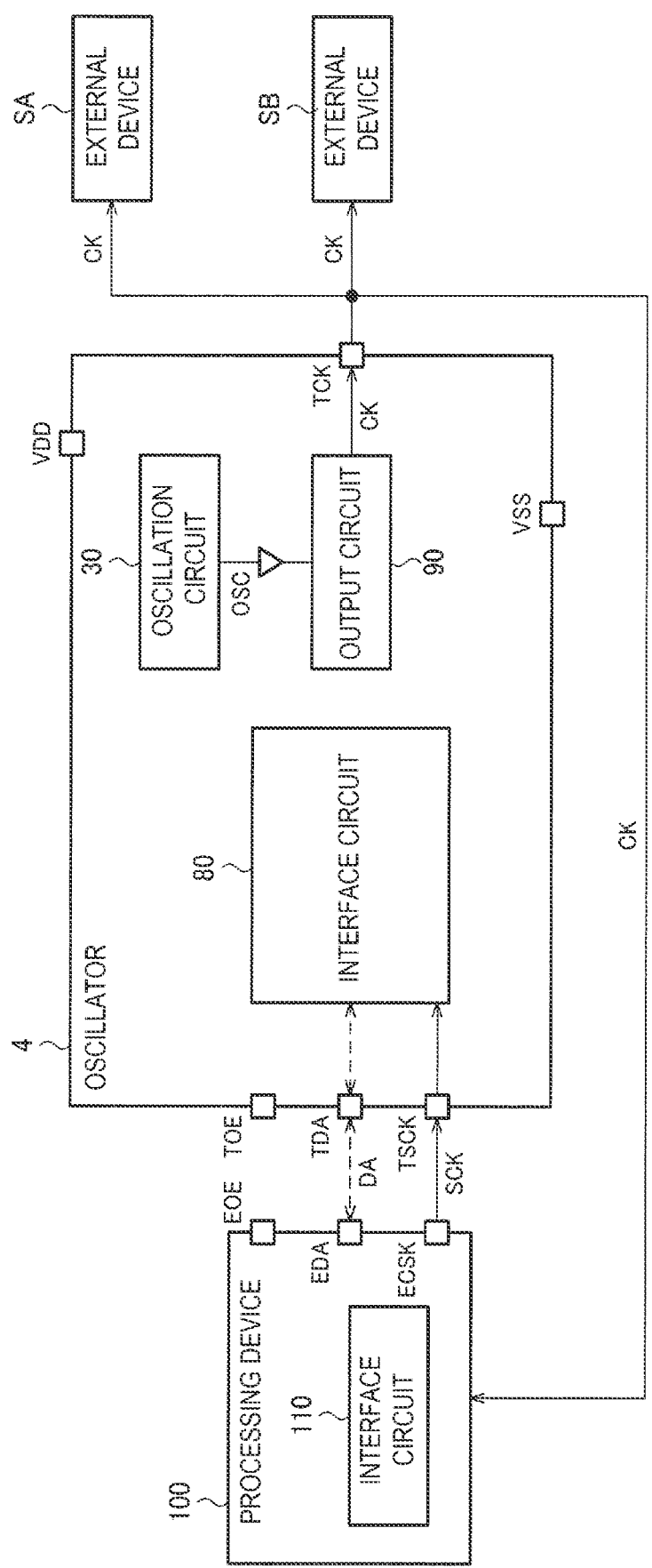
FIG. 12 is a schematic diagram when the present embodiment is not applied in a 6-terminal oscillator.

FIG. 12 is a diagram showing a state of a communication mode of the oscillator 4 when the present embodiment is not applied. The oscillator 4 in FIG. 12 is a 6-terminal oscillator including the power supply terminal TVDD, the ground terminal TGND, the clock output terminal TCK, the output enable terminal TOE, the first terminal TDA that is a data terminal, and the serial clock input terminal TSCK. In addition, in the oscillator 4 in FIG. 12, components other than the external terminals are shown in a simplified manner in order to pay attention to a difference in the communication state. The same applies to FIG. 13.

In FIG. 12, the oscillator 4 outputs the clock signal CK to the external processing device 100 that is a master, the external device SA, or the like. Further, the processing device 100 that is a master outputs the serial clock signal SCK as a communication clock for the data communication between the oscillator 4 that is a slave and the processing device 100 via a serial clock input terminal ESCK. A frequency of the serial clock signal SCK output by the processing device 100 is usually different from the frequency of the clock signal CK output by the oscillator 4. Therefore, the serial clock signal SCK for communication interferes with the clock signal CK, and noise such as jitter noise is generated in the clock signal CK. That is, since the clock signal CK output from the oscillator 4 and the serial clock signal SCK for the communication from the processing device 100 are asynchronous, the noise due to the serial clock signal SCK for the communication is superimposed on the clock signal CK, and noise such as jitter noise is generated with respect to the clock signal CK. Thus, a clock signal characteristic of the clock signal CK is deteriorated, which adversely affects an operating state of the processing device 100, the external device SA, or the external device SB that operates based on the clock signal CK.

Figure 13:
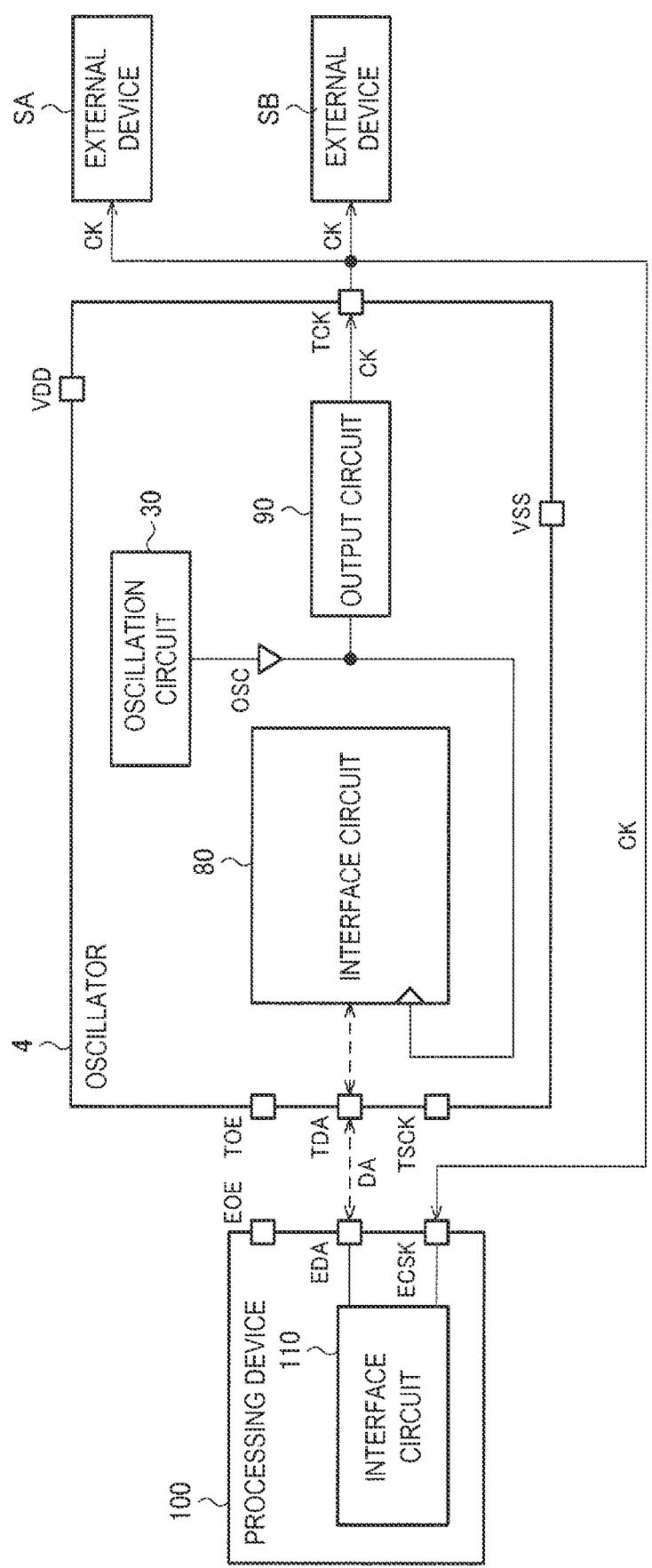
FIG. 13 is a schematic diagram when the present embodiment is applied to the 6-terminal oscillator.

In this regard, as shown in FIG. 13, in the configuration to which the present embodiment is applied, the data communication is performed using the clock signal CK output by the slave oscillator 4 instead of the serial clock signal SCK for the communication output by the master. That is, the clock signal CK output to the outside by the oscillator 4 is used as a clock signal for operation of the processing device 100 and the like, and at the same time, is also used as a clock signal for communication between the master and the slave. Therefore, as in FIG. 12, it is possible to effectively prevent a problem that the noise due to the serial clock signal SCK for the communication is superimposed on the clock signal CK and the clock signal characteristic is deteriorated.

3. Device

Figure 14:
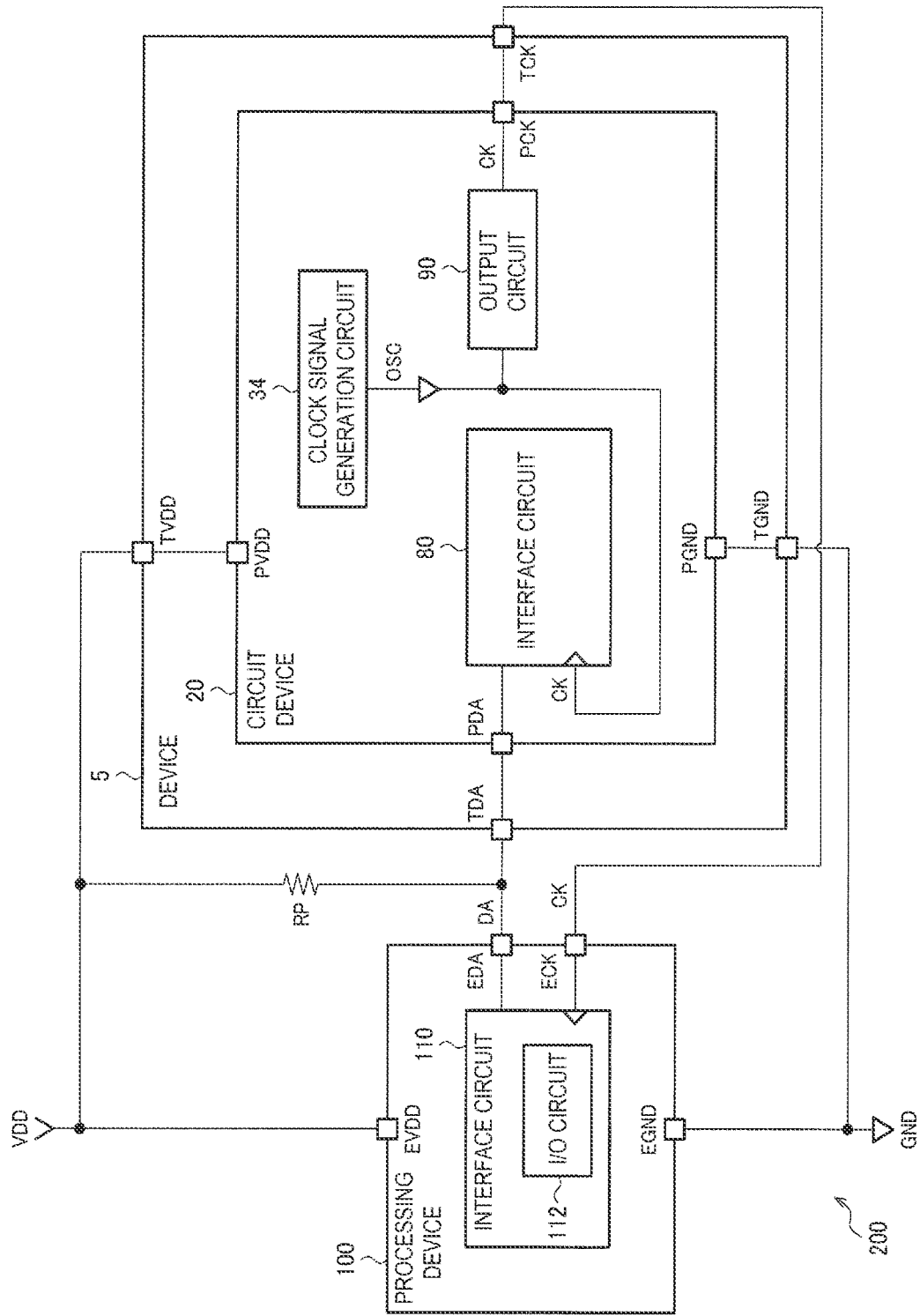
FIG. 14 shows a configuration example of a device according to the present embodiment.

FIG. 14 shows a configuration example of a device 5 according to the present embodiment. FIG. 14 also shows a configuration of the processing system 200 including the device 5 and the processing device 100. The device 5 performs data communication with the processing device 100. The device 5 includes the circuit device 20. The circuit device 20 includes the interface circuit 80, the output circuit 90, and a clock signal generation circuit 34.

The device 5 according to the present embodiment shown in FIG. 14 includes: the clock signal generation circuit 34 that generates the clock signal CK; the clock output terminal TCK; the output circuit 90 that outputs the clock signal CK to the external processing device 100 via the clock output terminal TCK; the first terminal TDA; and the interface circuit 80 that executes communication with the processing device 100 by the data signal DA. In the communication, the output circuit 90 outputs the clock signal CK to the processing device 100 that is a master for the communication. Further, the interface circuit 80 that is a slave for the communication receives the data signal DA, which is transmitted from the processing device 100 and synchronized with the clock signal CK, via the first terminal TDA, or transmits the data signal DA to the processing device 100 via the first terminal TDA in synchronization with the clock signal CK.

The clock signal generation circuit 34 is a circuit that generates the clock signal CK. The clock signal generation circuit 34 generates the clock signal CK by, for example, crystal oscillation, LC oscillation, CR oscillation, or oscillation using a ceramic element.

According to the present embodiment, the data communication between the processing device 100 and the device 5 can be performed using the clock signal CK output by the device 5. Therefore, even when the number of external terminals of the device 5 is small, it is possible to perform both the output of the clock signal CK from the device 5 and the data communication between the processing device 100 and the device 5. Alternatively, as described with reference to FIGS. 12 and 13 described above, it is possible to prevent a situation in which noise due to the serial clock signal SCK for the communication is superimposed on the clock signal CK and the clock signal characteristic is deteriorated.

As the device 5 in FIG. 14, various devices other than the oscillator 4 can be assumed. For example, the device 5 may be a sensor device such as a gyro sensor or an acceleration sensor, a display device that displays an image on a display panel, a communication device that performs communication according to a predetermined communication standard, a drive device that drives a predetermined mechanism of a printer, or a power supply device that performs supply or control of the power supply. The circuit device 20 according to the present embodiment is not limited to one incorporated in the device 5, and may be an integrated circuit (IC) incorporated in the above-described sensor device, display device, communication device, power supply device, or the like. For example, when the device 5 is a gyro sensor, the circuit device 20 may include a drive circuit that drives a resonator of the gyro sensor, a detection circuit that detects a sensor signal from the resonator 10, and the like. When the device 5 is an acceleration sensor, the circuit device 20 may include a drive circuit and a detection circuit of an acceleration sensor element implemented by micro electro mechanical systems (MEMS) or the like. When a sensor is a display device, the circuit device 20 may include a drive circuit of the display panel, a logic circuit for processing display data, and the like.

When the sensor is a communication device, the circuit device 20 may include a physical layer circuit, a link layer circuit, and a logic circuit for communication. In this way, circuits having various configurations can be adopted as the circuit device 20. In each of the above cases, the circuit device 20 includes the interface circuit 80, and performs data communication with the processing device 100 that is a master.

Figure 15:
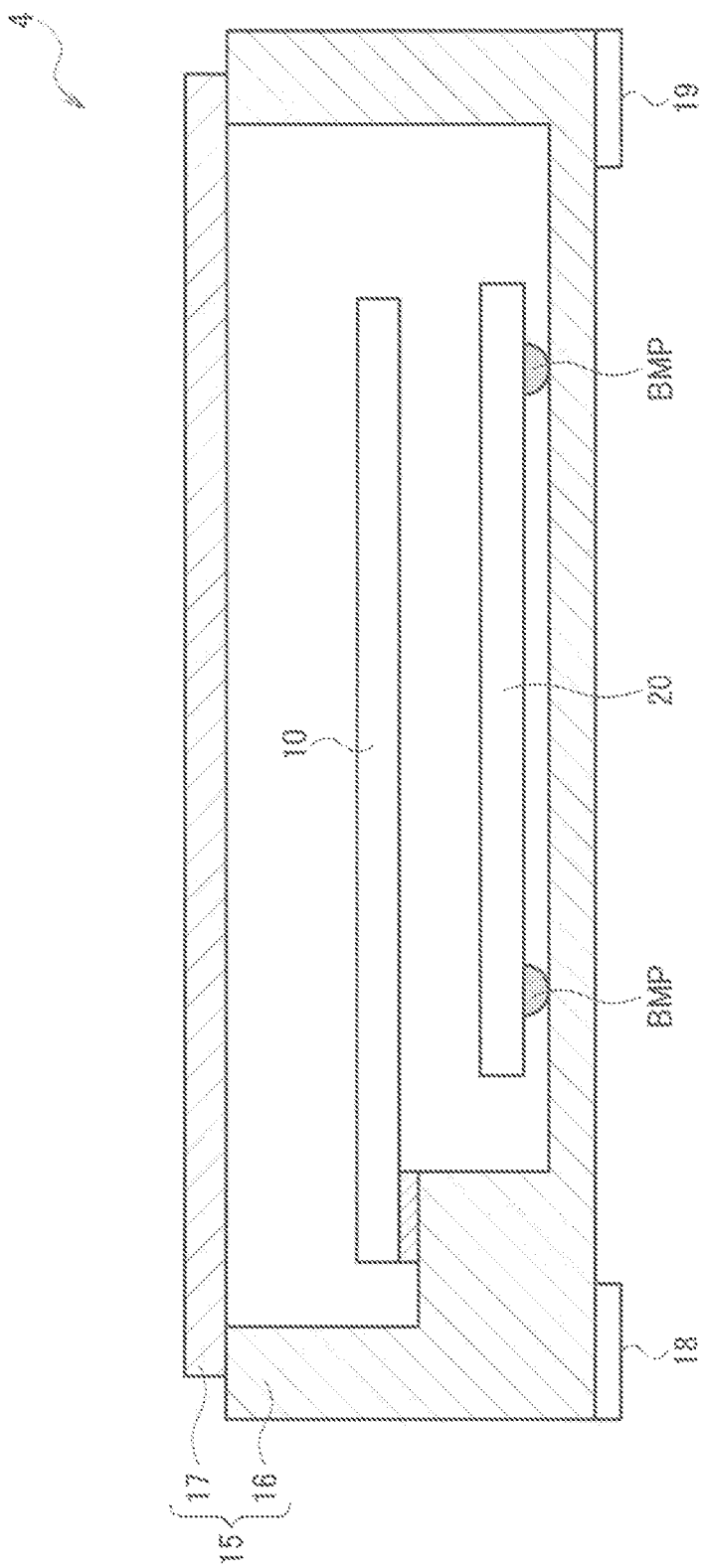
FIG. 15 shows a first structure example of the oscillator.

FIG. 15 shows a first structure example of the oscillator 4 according to the present embodiment. The oscillator 4 includes the resonator 10, the circuit device 20, and a package 15 that houses the resonator 10 and the circuit device 20. The package 15 is made of, for example, ceramic or the like and has a housing space inside the package 15, and the resonator 10 and the circuit device 20 are housed in the housing space. The housing space is hermetically sealed and is preferably in a decompressed state, which is a state close to vacuum. The package 15 can suitably protect the resonator 10 and the circuit device 20 from an impact, dust, heat, moisture, or the like.

The package 15 includes a base 16 and a lid 17. Specifically, the package 15 includes the base 16 that supports the resonator 10 and the circuit device 20, and the lid 17 that is joined to an upper surface of the base 16 to define the housing space between the lid 17 and the base 16. The resonator 10 is supported by a step portion provided inside the base 16 via a terminal electrode. The circuit device 20 is disposed at an inner bottom surface of the base 16. Specifically, the circuit device 20 is disposed such that an active surface faces the inner bottom surface of the base 16. The active surface is a surface at which the circuit elements of the circuit device 20 are formed. Further, bumps BMP are formed at terminals of the circuit device 20. The circuit device 20 is supported by the inner bottom surface of the base 16 via the conductive bumps BMP. The conductive bumps BMP are, for example, metal bumps, and the resonator 10 is electrically coupled to the circuit device 20 via the bumps BMP, an internal wiring of the package 15, the terminal electrode, and the like. The circuit device 20 is electrically coupled to external terminals 18 and 19 of the oscillator 4 via the bumps BMP and the internal wiring of the package 15. The external terminals 18 and 19 are formed at an outer bottom surface of the package 15. The external terminals 18 and 19 are coupled to an external device via an external wiring. The external wiring is, for example, wiring formed at a circuit board on which the external device is mounted. Accordingly, a clock signal or the like can be output to the external device.

In FIG. 15, the circuit device 20 is flip-chip mounted such that the active surface of the circuit device 20 faces downward, and the present embodiment is not limited to such mounting. For example, the circuit device 20 may be mounted such that the active surface of the circuit device 20 faces upward. That is, the circuit device 20 is mounted such that the active surface faces the resonator 10.

Figure 16:
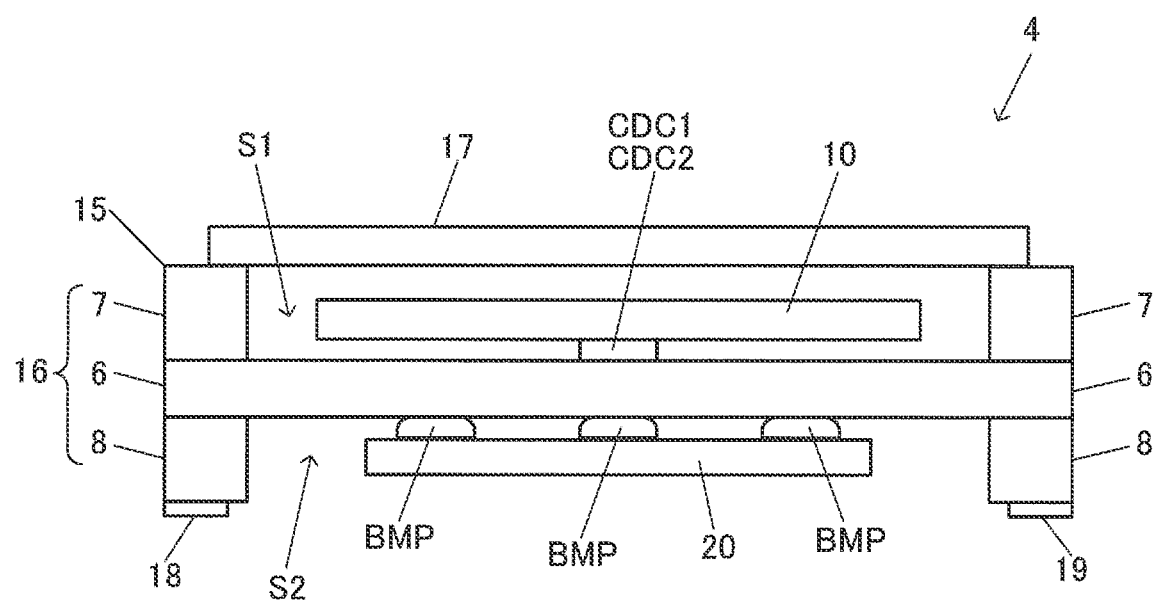
FIG. 16 shows a second structure example of the oscillator.

FIG. 16 shows a second structure example of the oscillator 4. The oscillator 4 includes the resonator 10, the circuit device 20, and the package 15 that houses the resonator 10 and the circuit device 20. The package 15 includes the base 16 and the lid 17. The base 16 includes: a first substrate 6 that is an intermediate substrate; a second substrate 7 having a substantially rectangular frame shape that is stacked on an upper surface side of the first substrate 6; and a third substrate 8 having a substantially rectangular frame shape that is stacked on a bottom surface side of the first substrate 6. The lid 17 is joined to an upper surface of the second substrate 7, and the resonator 10 is housed in a housing space S1 defined by the first substrate 6, the second substrate 7, and the lid 17. For example, the resonator 10 is hermetically sealed in the housing space S1 and is preferably in a decompressed state, which is a state close to vacuum. Accordingly, the resonator 10 can be suitably protected from an impact, dust, heat, moisture, or the like. The circuit device 20 that is a semiconductor chip is housed in a housing space S2 defined by the first board and the third substrate 8. The external terminals 18 and 19 that are electrode terminals of the oscillator 4 for external coupling are formed at a bottom surface of the third substrate 8.

In the housing space S1, the resonator 10 is coupled to a first electrode terminal and a second electrode terminal (not shown) formed at an upper surface of the first substrate 6 by conductive coupling portions CDC1 and CDC2. The conductive coupling portions CDC1 and CDC2 may be implemented by conductive bumps such as metal bumps, or be implemented by a conductive adhesive. Specifically, for example, a first electrode pad (not shown) formed at one end of the tuning-fork type resonator 10 is coupled to the first electrode terminal formed at the upper surface of the first substrate 6 via the conductive coupling portion CDC1. The first electrode terminal is electrically coupled to the pad PX1 of the circuit device 20. A second electrode pad (not shown) formed at the other end of the tuning-fork type resonator 10 is coupled to the second electrode terminal formed at the upper surface of the first substrate 6 via the conductive coupling portion CDC2. The second electrode terminal is electrically coupled to the pad PX2 of the circuit device 20. Accordingly, the one end and the other end of the resonator 10 can be electrically coupled to the pads PX1 and PX2 of the circuit device 20 via the conductive coupling portions CDC1 and CDC2. The conductive bumps BMP are formed at a plurality of pads of the circuit device 20 that is a semiconductor chip, and these conductive bumps BMP are coupled to a plurality of electrode terminals formed at a bottom surface of the first substrate 6. The electrode terminals coupled to the pads of the circuit device 20 are electrically coupled to the external terminals 18 and 19 of the oscillator 4 via the internal wiring and the like.

The oscillator 4 may be an oscillator of a wafer level package (WLP). In this case, the oscillator 4 includes: a base including a semiconductor substrate and a penetration electrode penetrating a first surface and a second surface of the semiconductor substrate; the resonator 10 fixed to the first surface of the semiconductor substrate via a conductive joining member such as a metal bump; and an external terminal provided on a second surface side of the semiconductor substrate via an insulating layer such as a relocation wiring layer. An integrated circuit serving as the circuit device 20 is formed at the first surface or the second surface of the semiconductor substrate. In this case, by bonding a first semiconductor wafer to a second semiconductor wafer, a plurality of bases are joined to a plurality of lids, and then the oscillator 4 is separated by a dicing saw or the like. At the first semiconductor wafer, the plurality of bases in which the resonator 10 and the integrated circuit are arranged are formed, and at the second semiconductor wafer, the plurality of lids are formed. In this way, the oscillator 4 of the wafer level package can be implemented, and the oscillator 4 can be manufactured with high throughput and low cost.

As described above, an oscillator according to the present embodiment relates to an oscillator including: a resonator; an oscillation circuit configured to generate an oscillation signal by the resonator; a clock output terminal; an output circuit configured to output a clock signal to an external processing device via the clock output terminal; a first terminal; and an interface circuit configured to execute communication with the processing device by a data signal. In the communication, the output circuit outputs the clock signal to the processing device that is a master for the communication, and the interface circuit that is a slave for the communication receives, via the first terminal, the data signal that is transmitted from the processing device and synchronized with the clock signal, or transmits, via the first terminal, the data signal to the processing apparatus in synchronization with the clock signal.

According to the present embodiment, data communication between the processing device and the oscillator can be performed using the clock signal output by the oscillator. Therefore, it is possible to perform both the output of the clock signal from the oscillator and data communication between the external device that is a master and the oscillator that is a slave.

In the present embodiment, the first terminal may be an output enable terminal that switches enabling or disabling of the output of the clock signal.

In this way, the first terminal can also function not only as a terminal that transmits and receives the data signal, but also as a terminal that controls on and off of the output of the clock signal of the oscillator.

In the present embodiment, the interface circuit may start the communication on condition that a communication start key is received from the processing device.

In this way, the communication between the master and the slave is started on condition that the communication start key of an appropriate code is transmitted from the master to the slave, and thus it is possible to prevent erroneous determination of start of the communication due to noise or the like included in the data signal.

In the present embodiment, the oscillator may be a 4-terminal oscillator including a power supply terminal, a ground terminal, the clock output terminal, and the first terminal.

In this way, in the oscillator in which the number of external terminals is only 4, regardless of whether the data communication is being performed between the external device that is a master and the oscillator that is a slave, the clock signal can be continuously output from the oscillator.

In the present embodiment, the output circuit may output the clock signal even in a period other than a period of the communication.

In this way, the oscillator can output the clock signal as a slave for communication and maintain an operating state of the processing device or another external device.

In the present embodiment, a data line coupling the processing device and the interface circuit may be pulled up, and the interface circuit may include an I/O circuit including an open-drain N-type transistor.

In this way, even when neither the master nor the slave drives the data line of the data signal to a low level by the open-drain N-type transistor, the data line is pulled up to a high level, and thus the serial data communication using the data line is possible.

In the present embodiment, after receiving first data of a predetermined number of bits, the interface circuit may determine that the communication is continued when the processing device outputs a low level, and may receive next second data of the predetermined number of bits.

In this way, the interface circuit can continuously receive the data signal in a unit of the predetermined number of bits, and can determine that the communication is stopped when the processing device does not output a low level.

In the present embodiment, after transmitting first data of a predetermined number of bits, the interface circuit may determine that the communication is continued when the processing device outputs a low level, and may transmit next second data of the predetermined number of bits.

In this way, the interface circuit can continuously transmit the data signal in a unit of the predetermined number of bits, and can determine that the communication is stopped when the processing device does not output a low level.

In the present embodiment, the circuit device may further include a temperature sensor circuit configured to output temperature detection data and a temperature compensation circuit configured to perform temperature compensation of an oscillation frequency of the oscillation signal based on the temperature detection data. The interface circuit may transmit the temperature detection data to the processing device via the first terminal.

In this way, it is possible to perform the temperature compensation of the oscillation frequency based on the temperature detection data, and it is also possible to detect the temperature using the temperature detection data in the processing device that is a master.

In the present embodiment, the interface circuit may receive frequency setting data of the clock signal from the processing device via the first terminal.

In this way, the frequency of the clock signal output by the oscillator can be set to a desired frequency by the frequency setting data from the processing device while the oscillator outputs the clock signal.

In addition, a device according to the present embodiment relates to a device including: a clock signal generation circuit configured to generate a clock signal; a clock output terminal; an output circuit configured to output the clock signal to an external processing device via the clock output terminal; a first terminal; and an interface circuit configured to execute communication with the processing device by a data signal. In the communication, the output circuit outputs the clock signal to the processing device that is a master for the communication, and the interface circuit that is a slave for the communication receives, via the first terminal, the data signal that is transmitted from the processing device and synchronized with the clock signal, or transmits, via the first terminal, the data signal to the processing apparatus in synchronization with the clock signal.

According to the present embodiment, the data communication between the processing device and the device can be performed using the clock signal output by the device. Therefore, it is possible to perform both the output of the clock signal from the device and the data communication between the external device that is a master and the device that is a slave.

Although the present embodiment has been described in detail as described above, it will be readily apparent to those skilled in the art that various modifications may be made without departing substantially from novel matters and effects of the present disclosure. Therefore, all such modifications are intended to be included within the scope of the present disclosure. For example, a term cited with a different term having a broader meaning or the same meaning at least once in the specification or in the drawings can be replaced with the different term in any place in the description or in the drawings. In addition, all combinations of the present embodiment and the modifications are also included in the scope of the present disclosure. Further, the configuration and operation of the oscillator, the device, the processing device, and the like are not limited to those described in the present embodiment, and various modifications can be made.

What is claimed is:

1. An oscillator comprising:
a resonator;
an oscillation circuit configured to generate an oscillation signal by the resonator;
a clock output terminal;
an output circuit configured to output a clock signal to an external processing device via the clock output terminal;
a first terminal; and
an interface circuit configured to execute communication with the processing device by a data signal, wherein
in the communication,
the output circuit outputs the clock signal to the processing device that is a master for the communication, and
the interface circuit that is a slave for the communication receives, via the first terminal, the data signal that is transmitted from the processing device and synchronized with the clock signal, or transmits, via the first terminal, the data signal to the processing device in synchronization with the clock signal.

2. The oscillator according to claim 1, wherein
the first terminal is an output enable terminal that switches enabling or disabling of the output of the clock signal.

3. The oscillator according to claim 1, wherein
the interface circuit starts the communication on condition that a communication start key is received from the processing device.

4. The oscillator according to claim 1, wherein
the oscillator is a 4-terminal oscillator including a power supply terminal, a ground terminal, the clock output terminal, and the first terminal.

5. The oscillator according to claim 1, wherein
the output circuit outputs the clock signal even during a period other than a period of the communication.

6. The oscillator according to claim 1, wherein
a data line coupling the processing device and the interface circuit is pulled up, and
the interface circuit includes an I/O circuit including an open-drain N-type transistor.

7. The oscillator according to claim 1, wherein
after receiving first data of a predetermined number of bits, the interface circuit determines that the communication is continued when the processing device outputs a low level, and receives next second data of the predetermined number of bits.

8. The oscillator according to claim 1, wherein
after transmitting first data of a predetermined number of bits, the interface circuit determines that the communication is continued when the processing device outputs a low level, and transmits next second data of the predetermined number of bits.

9. The oscillator according to claim 1, further comprising:
a temperature sensor circuit configured to output temperature detection data; and
a temperature compensation circuit configured to perform temperature compensation of an oscillation frequency of the oscillation signal based on the temperature detection data, wherein
the interface circuit transmits the temperature detection data to the processing device via the first terminal.

10. The oscillator according to claim 1, wherein
the interface circuit receives frequency setting data of the clock signal from the processing device via the first terminal.

11. A device comprising:
a clock signal generation circuit configured to generate a clock signal;
a clock output terminal;
an output circuit configured to output the clock signal to an external processing device via the clock output terminal;
a first terminal; and
an interface circuit configured to execute communication with the processing device by a data signal, wherein
in the communication,
the output circuit outputs the clock signal to the processing device that is a master for the communication, and
the interface circuit that is a slave for the communication receives, via the first terminal, the data signal that is transmitted from the processing device and synchronized with the clock signal, or transmits, via the first terminal, the data signal to the processing device in synchronization with the clock signal.

* * * * *